United States Patent [19]
Takino

[11] Patent Number: 5,831,994
[45] Date of Patent: Nov. 3, 1998

[54] SEMICONDUCTOR DEVICE TESTING FIXTURE

[75] Inventor: Taizo Takino, Tokyo, Japan

[73] Assignee: Mitsubishi Denki Kabushiki Kaisha, Tokyo, Japan

[21] Appl. No.: 794,345

[22] Filed: Feb. 3, 1997

[30] Foreign Application Priority Data

Sep. 2, 1996 [JP] Japan .................................. 8-231859

[51] Int. Cl.⁶ .................................................. G01R 31/28
[52] U.S. Cl. ...................... 371/25.1; 371/22.1; 371/22.5
[58] Field of Search ................................... 71/25.1, 22.1, 71/27.1, 21.2, 22.5

[56] References Cited

U.S. PATENT DOCUMENTS

| | | | |
|---|---|---|---|
| 4,825,098 | 4/1989 | Aoyama | 307/243 |
| 4,887,267 | 12/1989 | Kanuma | 371/22.31 |
| 5,257,359 | 10/1993 | Blasco et al. | 711/138 |
| 5,265,102 | 11/1993 | Saito | 371/27 |
| 5,570,040 | 10/1996 | Lytle et al | 326/41 |
| 5,701,306 | 12/1997 | Arai | 371/22.1 |

FOREIGN PATENT DOCUMENTS

| | | |
|---|---|---|
| 63-265181 | 11/1988 | Japan . |
| 5-150013 | 6/1993 | Japan . |
| 8-29487 | 2/1996 | Japan . |

Primary Examiner—Ly Hua
Attorney, Agent, or Firm—Burns, Doane, Swecker & Mathis, LLP

[57] ABSTRACT

A semiconductor device testing fixture is provided in which the performance tests of a semiconductor device can be executed without increasing the time for testing and the equipment investment for a semiconductor tester with an increase in the practical operating frequency of a tested semiconductor device. A semiconductor device testing fixture (1A) has input terminals (2, 3, 4) and an output terminal (15) for receiving and sending a signal together with a semiconductor tester (18). These terminals are connected to the predetermined terminals of the semiconductor tester (8). A memory (7) which can perform first in first out operation is mounted as signal holding means on the semiconductor device testing fixture (1A).

15 Claims, 21 Drawing Sheets

SEMICONDUCTOR DEVICE TESTING FIXTURE

BACKGROUND OF THE INVENTION

1. Field of the Invention

The present invention relates to a semiconductor device testing fixture used for the performance tests of a semiconductor device, and more particularly to a semiconductor device testing fixture which enables to test a semiconductor device at a practical operating frequency.

2. Description of the Background Art

FIG. 21 shows the structure of a semiconductor device testing fixture 1 for use in testing a semiconductor device. In FIG. 21, a tested semiconductor device (hereinafter referred to as a DUT) 6 which acts as a subject is mounted on the conventional semiconductor device testing fixture 1, and a semiconductor tester 8 for testing the DUT 6 is connected to the semiconductor device testing fixture 1.

The semiconductor device testing fixture 1 has input terminals 2 and 3 and an output terminal 5 for receiving and sending a signal together with the semiconductor tester 8. These terminals are connected to the predetermined terminals of the semiconductor tester 8 and a pin terminal of the DUT 6 is connected to a predetermined connecter of the semiconductor device testing fixture 1 so that the DUT 6 is electrically connected to the semiconductor tester 8. The semiconductor device testing fixture 1 has a structure in which the DUT 6 is removable. Therefore, when the DUT 6 is completely tested, the DUT 6 is removed from the semiconductor device testing fixture 1 and the next DUT 6 is attached to be tested.

In the test of a semiconductor device, generally, a predetermined signal is inputted from the semiconductor tester 8 to the DUT 6 through the input terminals 2 and 3 of the semiconductor device testing fixture 1 so as to cause the DUT 6 to operate, the output of the DUT 6 is inputted to the semiconductor tester 8 through the output terminal 5 to compare a value of the output with an output expected value prepared in the semiconductor tester 8 in advance. Thus, it is judged whether or not the DUT 6 operates normally.

Nonconformity is caused by a difference in the operating speed between the semiconductor tester 8 and the DUT 6. In general, the operating frequency of the DUT 6 is increased with the development of an apparatus. It is necessary to give an input signal having a practical operating frequency to the DUT 6 to observe the results of the performance tests of the DUT 6.

In the semiconductor tester 8, a test pattern can be given only at a maximum test frequency having a value which indicates the testing capability of the semi-conductor tester 8. However, a clock signal can be outputted plural times while one test pattern is given (during one test cycle). Consequently, an input signal having a frequency which is apparently equal to the operating frequency of the DUT 6 can be given by increasing the frequency of the clock signal.

However, the observation of the output value of the DUT 6 is restricted with the maximum test frequency of the semiconductor tester 8. The reason is that only one expected value prepared in the semiconductor tester 8 can be set to one test pattern and the output value of the DUT 6 can be observed only at a speed corresponding to the maximum test frequency of the semiconductor tester 8.

In general, the maximum test frequency of the semiconductor tester 8 is lower than the practical operating frequency of the DUT 6. Consequently, even though the performance tests of the DUT 6 are executed at a high speed, the results of the tests cannot be judged at a speed which is equal to the operating speed of the DUT 6 in the semiconductor tester 8.

For example, even though the clock signal is inputted to the DUT 6 twice for one test cycle so that the DUT 6 can be caused to operate at a speed which is twice as much as the maximum test frequency of the semiconductor tester 8, the output signal can be observed only once for one test cycle. Therefore, a method has been employed in which one test cycle is divided into two portions and a test is performed twice to judge whether or not the output signal is good, for example, a test for observing the first part of the test cycle is performed and a test for observing the second part of the test cycle is then performed. Consequently, the time for testing is increased with an increase in the practical operating frequency of the DUT 6.

The results of the performance tests of the DUT 6 can be judged at the speed which is equal to the operating speed of the DUT 6 by using the semiconductor tester 8 having the maximum test frequency which is equal to the practical operating frequency of the DUT 6. However, since the semiconductor tester 8 is expensive, equipment investment is increased. As a result, the test cost of the DUT 6, and furthermore, the manufacturing cost thereof are increased.

SUMMARY OF THE INVENTION

A first aspect of the present invention is directed to a semiconductor device testing fixture for electrically connecting a semiconductor tester to a tested semiconductor device, the semiconductor tester executing the performance tests of the tested semiconductor device by giving a test pattern to the tested semiconductor device to compare the output signal of the tested semiconductor device which is outputted corresponding to the test pattern with a prepared expected value, comprising signal holding means connected to the tested semiconductor device for receiving the output signal of the tested semiconductor device, temporarily holding the output signal, and then sending the output signal to the semiconductor tester at a predetermined frequency, wherein the predetermined frequency is equal to or lower than a maximum test frequency having a value which indicates the testing capability of the semiconductor tester.

A second aspect of the present invention is directed to the semiconductor device testing fixture, wherein the signal holding means has at least one memory which can perform first in first out operation for data, the at least one memory has the function of fetching the output signal of the tested semiconductor device based on a first clock signal sent from the semiconductor tester, and outputting the output signal in order of fetch based on a second clock signal sent from the semiconductor tester.

A third aspect of the present invention is directed to the semiconductor device testing fixture, wherein the at least one memory is a plurality of memories, and at least a part of the plurality of memories are modularized, are removably attached to a predetermined connector, and are electrically connected to the tested semiconductor device and the semiconductor tester through the predetermined connector.

A fourth aspect of the present invention is directed to the semiconductor device testing fixture, wherein the signal holding means has a plurality of memories which can perform first in first out operation for data, the plurality of memories have the function of controlling the output of hold data on receipt of a predetermined signal, the data output terminals thereof being connected to the semiconductor tester in common, the plurality of memories fetch the output signal of the tested semiconductor device based on a first clock signal sent from the semiconductor tester, the semiconductor device testing fixture further comprising signal generating means for generating the predetermined signal to be individually sent to the plurality of memories, and for generating a third clock signal to be individually sent to the plurality of memories based on a second clock signal sent from the semiconductor tester, wherein the predetermined signal and the third clock signal are generated so as to be brought into the significant condition with different timings for the plurality of memories, and the plurality of memories output the output signal fetched based on the first clock signal if the predetermined signal is in the significant condition and the third clock signal is brought into the significant condition.

A fifth aspect of the present invention is directed to the semiconductor device testing fixture, wherein the signal generating means has the function of selectively sending, to the plurality of memories, the predetermined signal and the third clock signal which are in the significant condition.

A sixth aspect of the present invention is directed to the semiconductor device testing fixture, further comprising relay means interposed between a predetermined output terminal from which the output signal of the tested semiconductor device is outputted and a predetermined input terminal of the semiconductor tester to which the output signal is inputted for switching a path for the output signal so as to choose whether the output signal of the tested semiconductor device is sent to the signal holding means or is directly sent to the semiconductor tester without passing the holding means.

A seventh aspect of the present invention is directed to the semiconductor device testing fixture, wherein the relay means has a first relay device for electrically connecting or disconnecting the data input terminal of the signal holding means to or from the predetermined output terminal of the tested semiconductor device, and a second relay device for electrically connecting or disconnecting the data output terminal of the signal holding means to or from the predetermined input terminal of the semiconductor tester.

An eighth aspect of the present invention is directed to a semiconductor device testing fixture for electrically connecting a semiconductor tester to a tested semiconductor device, the semiconductor tester executing the performance tests of the tested semiconductor device by giving a test pattern to the tested semiconductor device to compare the output signal of the tested semiconductor device which is outputted corresponding to the test pattern with a prepared expected value, comprising signal holding means connected to the semiconductor tester for receiving the test pattern from the semiconductor tester, temporarily holding the test pattern, and then giving the test pattern to the tested semiconductor device at a predetermined frequency, wherein the predetermined frequency is the practical operating frequency of the tested semiconductor device.

A ninth aspect of the present invention is directed to the semiconductor device testing fixture, wherein the signal holding means has at least one memory which can perform first in first out operation for data, the at least one memory has the function of fetching the test pattern from the semiconductor tester based on a first clock signal sent from the semiconductor tester, and outputting the test pattern in order of fetch based on a second clock signal sent from the semiconductor tester.

A tenth aspect of the present invention is directed to the semiconductor device testing fixture, wherein the at least one memory is a plurality of memories, and at least a part of the plurality of memories are modularized, are removably attached to a predetermined connector, and are electrically connected to the semiconductor tester and the tested semiconductor device through the predetermined connector.

An eleventh aspect of the present invention is directed to the semiconductor device testing fixture, wherein the signal holding means has a plurality of memories which can perform first in first out operation for data, the plurality of memories have the function of controlling the input of data to be fetched on receipt of a predetermined signal, the plurality of memories output the fetched test pattern based on a first clock signal sent from the semiconductor tester, the semiconductor device testing fixture further comprising signal generating means for generating the predetermined signal to be individually sent to the plurality of memories, and for generating a third clock signal to be individually sent to the plurality of memories based on a second clock signal sent from the semiconductor tester, wherein the predetermined signal and the third clock signal are generated so as to be brought into the significant condition with different timings for the plurality of memories, and the plurality of memories fetch the test pattern based on the third clock signal if the predetermined signal is in the significant condition and the third clock signal is brought into the significant condition.

A twelfth aspect of the present invention is directed to the semiconductor device testing fixture, wherein the signal generating means has the function of selectively sending, to the plurality of memories, the predetermined signal and the third clock signal which are in the significant condition.

A thirteenth aspect of the present invention is directed to the semiconductor device testing fixture, further comprising relay means interposed between a predetermined output terminal from which the test pattern of the semiconductor tester is outputted and a predetermined input terminal of the tested semiconductor device to which the test pattern is inputted for switching a path for the test pattern so as to choose whether the test pattern of the semiconductor tester is sent to the signal holding means or is directly sent to the tested semiconductor device without passing the signal holding means.

A fourteenth aspect of the present invention is directed to the semiconductor device testing fixture, wherein the relay means has a first relay device for electrically connecting or disconnecting the data input terminal of the signal holding means to or from the predetermined output terminal of the semiconductor tester, and a second relay device for electrically connecting or disconnecting the data output terminal of the signal holding means to or from the predetermined input terminal of the tested semiconductor device.

A fifteenth aspect of the present invention is directed to a semiconductor device testing fixture for electrically connecting a semiconductor tester to a tested semiconductor device, the semiconductor tester executing the performance tests of the tested semiconductor device by giving a test pattern to the tested semiconductor device to compare the output signal of the tested semiconductor device which is outputted corresponding to the test pattern with a prepared expected value, comprising first signal holding means connected to the semiconductor tester for receiving the test pattern from the semiconductor tester, temporarily holding the test pattern, and then sending the test pattern to the tested semiconductor device at a first frequency, and second signal holding means connected to the tested semiconductor device for receiving the output signal of the tested semiconductor device, temporarily holding the output signal, and then sending the output signal to the semiconductor tester at a second frequency, wherein the first frequency is the practical operating frequency of the tested semiconductor device, and the second frequency is equal to or lower than a maximum test frequency having a value which indicates the testing capability of the semiconductor tester.

According to the first aspect of the present invention, also in the case where the maximum test frequency of the semiconductor tester is lower than the practical operating frequency of the tested semiconductor device, the output signal of the tested semiconductor device is temporarily held by the signal holding means and sent to the semiconductor tester at a frequency which is equal to or lower than the maximum test frequency having a value that indicates the testing capability of the semiconductor tester. Consequently, the tested semiconductor device can be tested at the practical operating frequency, and the output signal of the tested semiconductor device can be compared with the prepared expected value at a frequency which is equal to or lower than the maximum test frequency in the semiconductor tester. Accordingly, it is possible to suppress an increase in the time for testing with an increase in the practical operating frequency. In addition, it is not necessary to prepare a semiconductor tester having a maximum operating frequency which is equal to the practical operating frequency of the tested semiconductor device. Consequently, it is possible to prevent an increase in equipment investment with the increase in the practical operating frequency.

According to the second aspect of the present invention, the frequency of the first clock signal is set to the practical operating frequency of the tested semiconductor device, and the frequency of the second clock signal is set equal to or lower than the maximum test frequency of the semiconductor tester. Consequently, it is possible to obtain a specific structure in which the tested semiconductor device is tested at the practical operating frequency and the output signal of the tested semiconductor device is compared with the prepared expected value at a frequency which is equal to or lower than the maximum test frequency in the semiconductor tester.

According to the third aspect of the present invention, in the case where at least one memory is a plurality of memories, at least a part of the memories are modularized and removably attached to the predetermined connector. If the numbers of the outputs of the tested semiconductor device is different, the module is removed and a module which corresponds to the number of the outputs of the tested semiconductor device is attached. Thus, the semiconductor device testing fixture can be used for another purpose so that the manufacturing cost thereof can be reduced. In addition, the module is removed and attached to another semiconductor device testing fixture. Consequently, the module can be shared so that the manufacturing cost of the fixture can be reduced.

According to the fourth aspect of the present invention, in the case where the tested semiconductor device has a multibit output, the output signals are sent with time differences to the semiconductor tester. Consequently, the number of the input terminals of the semiconductor tester can be reduced. In addition, in the case where the number of the input terminals of the semiconductor tester is smaller than that of the output terminals of the tested semiconductor device, the batch of the outputs of the tested semiconductor device is outputted. Consequently, the results of tests can be observed for all the outputs of the tested semiconductor device.

According to the fifth aspect of the present invention, in the case where the tested semiconductor device has a multibit output, the outputs of a plurality of memories can be exclusively selected. Consequently, if the number of the outputs of the tested semiconductor device is smaller than that of the memories, output from unnecessary memories can be inhibited.

According to the sixth aspect of the present invention, the path for the output signal is switched so as to send the output signal to the signal holding means when performing the AC test of the tested semiconductor device, and to directly send the output signal of the tested semiconductor device to the semiconductor tester without using the signal holding means when performing the DC test of the tested semiconductor device. Consequently, it is possible to obtain the semiconductor device testing fixture which can be used for the DC test as well as the AC test.

According to the seventh aspect of the present invention, the data input terminal and the data output terminal of the signal holding means are completely disconnected electrically from the path through which the output signal of the tested semiconductor device is sent by the first and second relay devices when performing the AC test of the tested semiconductor device. Consequently, it is possible to prevent the signal holding means from becoming a load to change the output signal of the tested semiconductor device. Thus, the test can be performed with high precision.

According to the eighth aspect of the present invention, also in the case where the semiconductor tester cannot generate a test pattern having a frequency which is equal to the practical operating frequency of the tested semiconductor device, the test pattern of the semiconductor tester is temporarily held by the signal holding means and sent to the tested semiconductor device at the practical operating frequency of the tested semiconductor device. Consequently, the tested semiconductor device can be tested at the practical operating frequency.

According to the ninth aspect of the present invention, the frequency of the first clock signal is set equal to or lower than the maximum test frequency of the semiconductor tester, and the frequency of the second clock signal is set to the practical operating frequency of the tested semiconductor device. Consequently, it is possible to obtain a specific structure in which the tested semiconductor device is tested at the practical operating frequency.

According to the tenth aspect of the present invention, in the case where at least one memory is a plurality of memories, at least a part of the memories are modularized and removably attached to the predetermined connector. If the number of the outputs of the semiconductor tester is different, the module is removed and a module which corresponds to the number of the outputs of the semiconductor tester is attached. Thus, the semiconductor device testing fixture can be used for another purpose so that the manufacturing cost thereof can be reduced. In addition, the module is removed and attached to another semiconductor device testing fixture. Consequently, the module can be shared so that the manufacturing cost of the fixture can be reduced.

According to the eleventh aspect of the present invention, in the case where the semiconductor tester has a multibit output, the output signals are fetched in a plurality of memories with time differences, and are sent to the tested semiconductor device based on the first clock signal having a frequency which is equal to the practical operating frequency of the tested semiconductor device. Consequently, also in the case where the semiconductor tester cannot generate an input signal having a frequency which is almost equal to the practical operating frequency of the tested semiconductor device, the tested semiconductor device can be caused to operate at the practical operating frequency.

According to the twelfth aspect of the present invention, in the case where the semiconductor tester has a multibit output, the inputs of a plurality of memories can be exclusively selected. Consequently, if the number of the outputs of the semiconductor tester is smaller than that of the memories, input to unnecessary memories can be inhibited.

According to the thirteenth aspect of the present invention, the path for the test pattern is switched so as to send the test pattern to the signal holding means when performing the AC test of the tested semiconductor device, and to directly send the test pattern to the tested semiconductor device without using the signal holding means when performing the DC test of the tested semiconductor device. Consequently, it is possible to obtain the semiconductor device testing fixture which can be used for the DC test as well as the AC test.

According to the fourteenth aspect of the present invention, the data input terminal and the data output terminal of the signal holding means are completely disconnected electrically from the path through which the test pattern is given by the first and second relay devices when performing the AC test of the tested semiconductor device. Consequently, it is possible to prevent the signal holding means from becoming a load to change the test pattern. Thus, the test can be performed with high precision.

According to the fifteenth aspect of the present invention, also in the case where the semiconductor tester cannot generate a test pattern having a frequency which is equal to the practical operating frequency of the tested semiconductor device, the test pattern of the semiconductor tester is temporarily held by the first signal holding means and sent to the tested semiconductor device at the practical operating frequency of the tested semiconductor device. Consequently, the tested semiconductor device can be tested at the practical operating frequency. Furthermore, also in the case where the maximum test frequency of the semiconductor tester is lower than the practical operating frequency of the tested semiconductor device, the output signal of the tested semiconductor device is temporarily held by the second signal holding means and sent to the semiconductor tester at a frequency which is equal to or lower than the maximum test frequency having a value that indicates the testing capability of the semiconductor tester. Consequently, the output signal of the tested semiconductor device can be compared with the prepared expected value at a frequency which is equal to or lower than the maximum test frequency in the semiconductor tester. Accordingly, it is possible to suppress an increase in the time for testing with an increase in the practical operating frequency. In addition, it is not necessary to prepare a semiconductor tester having a maximum operating frequency which is equal to the practical operating frequency of the tested semiconductor device. Consequently, it is possible to prevent an increase in equipment investment with the increase in the practical operating frequency.

In order to solve the above-mentioned problems, it is an object of the present invention to provide a semiconductor device testing fixture which can execute the performance tests of a semiconductor device without increasing the time for testing and the equipment investment for a semiconductor tester with an increase in the practical operating frequency of a tested semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Embodiment>
<A-1. Structure of Apparatus>

Figure 1:
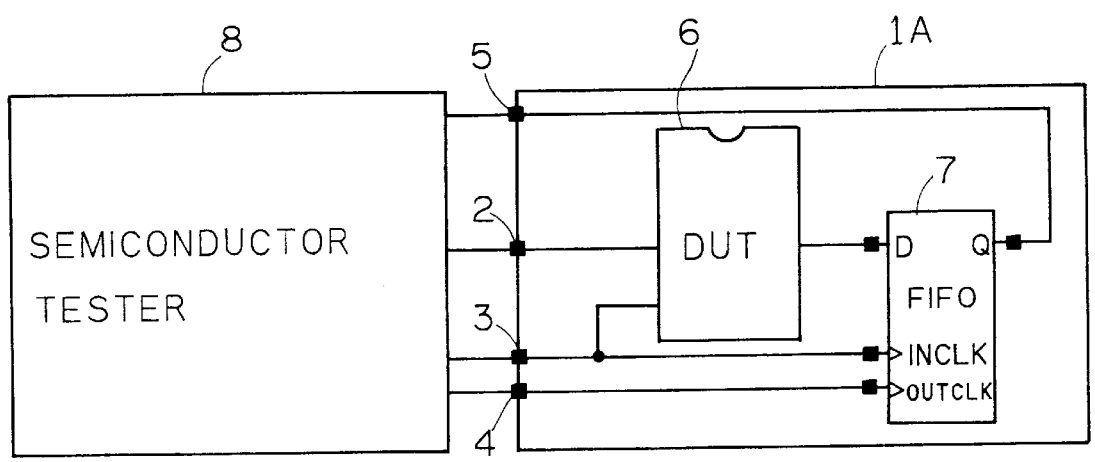
FIG. 1 is a block diagram for explaining the structure of a semiconductor device testing fixture according to a first embodiment of the present invention.

FIG. 1 shows the structure of a semiconductor device testing fixture 1A according to a first embodiment of the present invention.

In FIG. 1, a tested semiconductor device (hereinafter referred to as a DUT) 6 which acts as a subject is mounted on the semiconductor device testing fixture 1A, and a semiconductor tester 8 for testing the DUT 6 is connected to the semiconductor device testing fixture 1A.

The semiconductor device testing fixture 1A has input terminals 2, 3 and 4, and an output terminal 5 for receiving and sending a signal together with the semiconductor tester 8. These terminals are connected to the predetermined terminals of the semiconductor tester 8, respectively. A memory (hereinafter referred to as a FIFO) 7 is mounted on the semiconductor device testing fixture 1A. The FIFO 7 can perform first in first out operation as signal holding means.

In FIG. 1, the DUT 6 is connected to the input terminal 2 to which a test pattern is given from the semiconductor tester 8. The DUT 6 and the FIFO 7 are connected to the input terminal 3 to which a clock signal CL1 is sent from the semiconductor tester 8. The clock signal CL1 is sent to an input terminal INCLK in the FIFO 7.

The FIFO 7 is connected to the input terminal 4 to which a clock signal CL2 is sent from the semiconductor tester 8. The clock signal CL2 is sent to an input terminal OUTCLK in the FIFO 7. The output signal of the DUT 6 is sent to a data input terminal D of the FIFO 7. A data output terminal Q of the FIFO 7 is connected to the output terminal 5.

<A-2. Operation of Apparatus>

Figure 2:
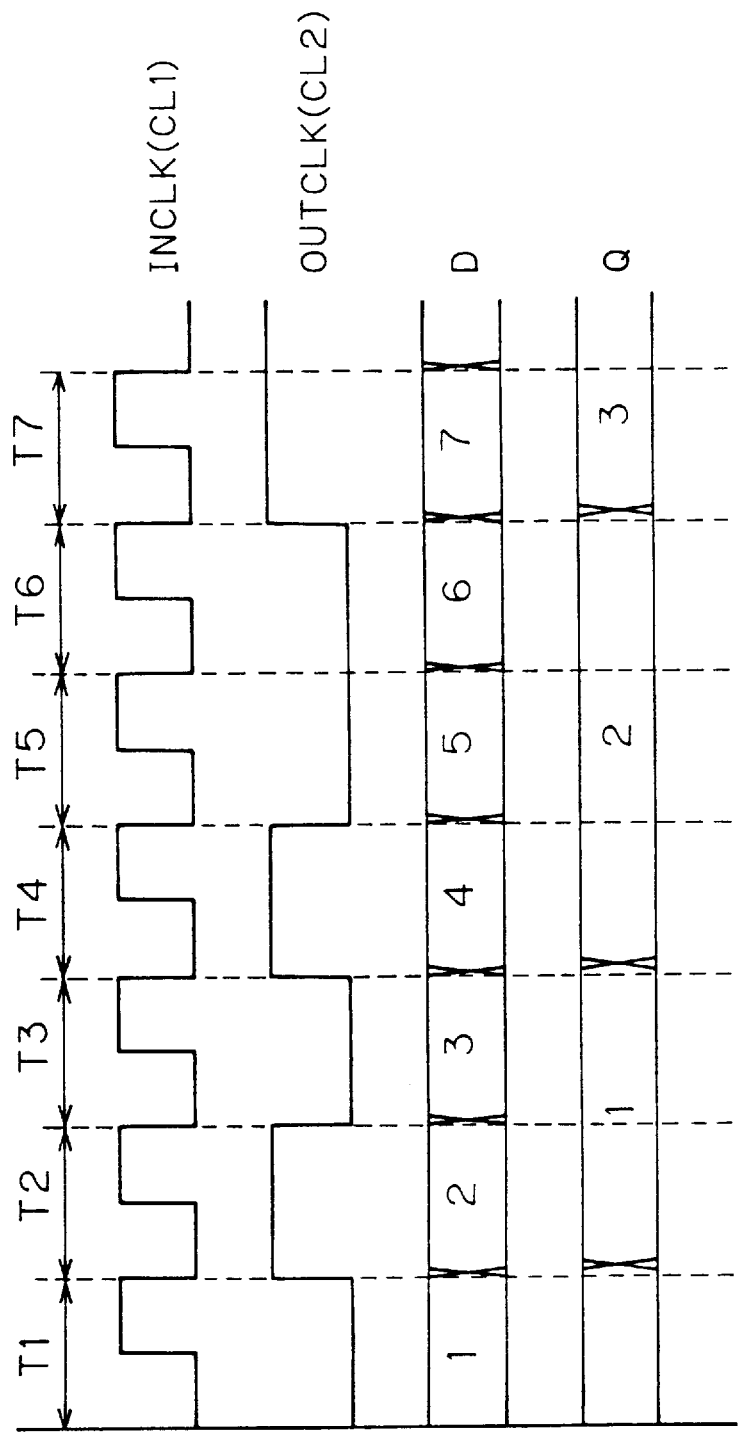
FIG. 2 is a timing chart for explaining the operation of the semiconductor device testing fixture according to the first embodiment of the present invention.

The operation of the semiconductor device testing fixture 1A will be described below with reference to FIG. 2 showing the operation of the FIFO 7.

The DUT 6 operates based on the test pattern given through the input terminal 2 and the clock signal CL1 sent through the input terminal 3 from the semiconductor tester 8. In this case, the clock signal CL1 is sent at a frequency which is equal to the practical operating frequency of the DUT 6. The DUT 6 outputs a signal for the result of operation performed at the practical operating frequency. The same output signal is sent to the data input terminal D of the FIFO 7.

The clock signal CL1 is sent to the input terminal INCLK of the FIFO 7 through the input terminal 3. As shown in FIG. 2, the output signal of the DUT 6 is temporarily fetched in the FIFO 7 with the timing of rise of the clock signal.

The clock signal CL2 is sent at a frequency which is equal to or lower than the maximum operating frequency of the semiconductor tester 8. The output signal of the DUT 6 fetched in the FIFO 7 is outputted from the data output terminal Q with the timing of rise of the clock signal CL2 as shown in FIG. 2. The order of output is identical to that of fetch.

More specifically, first data fetched in a cycle T1 of the clock signal CL1 in FIG. 2 is outputted from the data output terminal Q with the timing of the first rise of the clock signal CL2 (the fall of the clock signal CL1 in the cycle T1). The first data is continuously outputted until the second rise of the clock signal CL2 (the fall of the clock signal CL1 in a cycle T3). Second data which is fetched in a cycle 2 of the clock signal CL2 is started to be outputted with the timing of the second rise of the clock signal CL2.

The second data is continuously outputted until the third rise of the clock signal CL2 (the fall of the clock signal CL1 in a cycle T6). Third data which is fetched in the cycle T3 of the clock signal CL1 is started to be outputted with the timing of the third rise of the clock signal CL2.

Accordingly, if one cycle of the clock signal CL1 is a reference cycle, the cycle length of the first data outputted from the data output terminal Q is twice as much as the reference cycle. In addition, the cycle length of the second data outputted from the data output terminal Q is three times as much as the reference cycle.

<A-3. Characteristic Function and Effect>

Thus, the output signal of the DUT 6 is temporarily fetched in the FIFO 7 and outputted with the timing of the clock signal CL2 which can give an optional cycle so that the DUT 6 can be tested at the practical operating frequency and the output signal of the DUT 6 can be observed, in the semiconductor tester 8, at a frequency which is equal to or lower than the maximum operating frequency.

As compared with a method in which one test cycle is divided into plural portions to execute a test plural times to judge whether or not the output signal is good, the time for testing can be reduced more and it is possible to suppress an increase in the time for testing with an increase in the practical operating frequency. Furthermore, it is not necessary to prepare the semiconductor tester 8 having a maximum operating frequency which is equal to the practical operating frequency of the DUT 6. Consequently, it is possible to prevent an increase in equipment investment with the increase in the practical operating frequency.

While the semiconductor device testing fixture 1A shown in FIG. 1 has a structure in which the DUT 6 having a 1-bit input and a 1-bit output is mounted, it is apparent that the semiconductor device testing fixture 1A can also correspond to the case where a DUT having a multibit input and a multibit output is mounted. In that case, the FIFO 7 which can correspond to a multibit is used.

<B. Second Embodiment>
<B-1. Structure of Apparatus>

Figure 3:
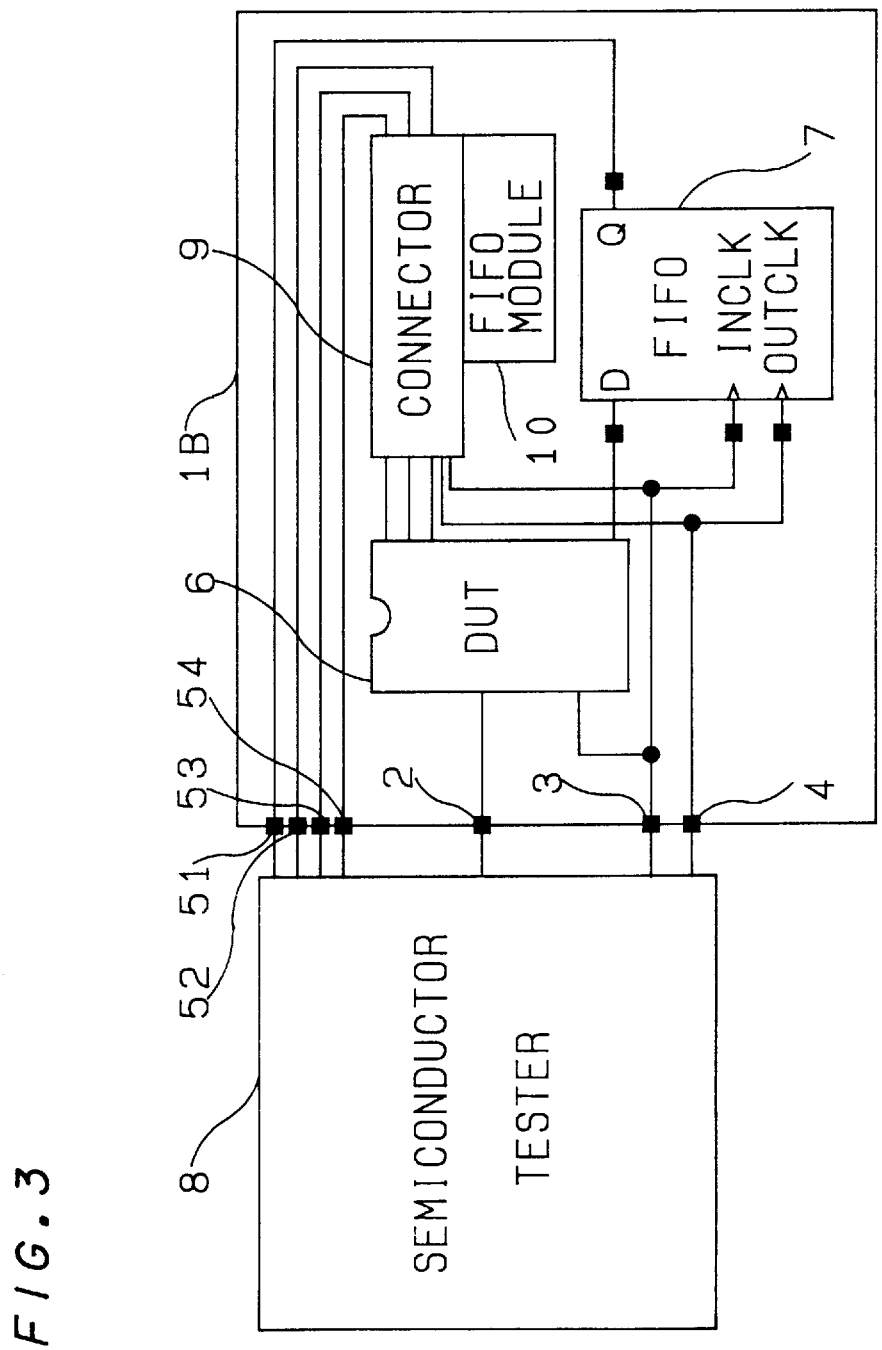
FIG. 3 is a block diagram for explaining the structure of a semiconductor device testing fixture according to a second embodiment of the present invention.

FIG. 3 shows the structure of a semiconductor device testing fixture 1B according to a second embodiment of the present invention.

While the output of the DUT 6 has 1 bit in the semiconductor device testing fixture 1A which has been described with reference to FIGS. 1 and 2, the output of the DUT 6 has a multibit in the following.

In FIG. 3, the DUT 6 is mounted on the semiconductor device testing fixture 1B, and a semiconductor tester 8 for testing the DUT 6 is connected to the semiconductor device testing fixture 1B.

The semiconductor device testing fixture 1B has input terminals 2, 3 and 4, and output terminals 51 to 54 for receiving and sending a signal together with the semiconductor tester 8. Furthermore, a FIFO 7 and a FIFO module 10 are mounted on the semiconductor device testing fixture 1B.

In FIG. 3, the DUT 6 is connected to the input terminal 2 to which a test pattern is given from the semiconductor tester 8.

The DUT 6 and the FIFO 7, and a connector 9 of the FIFO module 10 are connected to the input terminal 3 to which a clock signal CL1 is sent from the semiconductor tester 8. The clock signal CL1 is sent to an input terminal INCLK in the FIFO 7.

The FIFO 7 and the connector 9 are connected to the input terminal 4 to which a clock signal CL2 is sent from the semiconductor tester 8. The clock signal CL2 is sent to an input terminal OUTCLK in the FIFO 7. The output signal of the DUT 6 is sent to a data input terminal D of the FIFO 7 and the connector 9. A data output terminal Q of the FIFO 7 and the connector 9 of the FIFO module 10 are connected to the output terminals 51 to 54.

Figure 4:
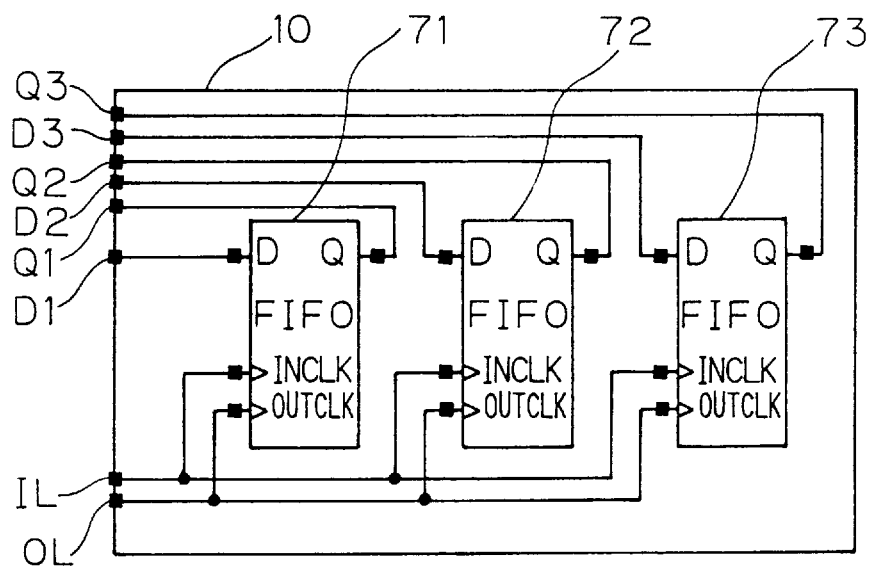
FIG. 4 is a block diagram for explaining the partial structure of the semiconductor device testing fixture according to the second embodiment of the present invention.

FIG. 4 shows the structure of the FIFO module 10. As shown in FIG. 4, FIFOs 71 to 73 which are identical to the FIFO 7 are mounted in the FIFO module 10.

Respective input terminals INCLK and OUTCLK of the FIFOs 71 to 73 are connected to external connecting terminals IL and OL in common. Data input terminals D of the FIFOs 71 to 73 are connected to external connecting terminals D1 to D3, respectively. Data output terminals Q of the FIFOs 71 to 73 are connected to external connecting terminals Q1 to Q3, respectively. The external connecting terminals IL, OL, D1 to D3, and Q1 to Q3 are connected, through the connector 9, to the input terminals 3 and 4, the predetermined output terminals of the DUT 6, and the output terminals 52 to 54, respectively.

<B-2. Operation of Apparatus>

The operation of the semiconductor device testing fixture 1B is basically the same as that of the semiconductor device testing fixture 1A which has been described with reference to FIG. 2. More specifically, the DUT 6 is caused to operate based on the test pattern given through the input terminal 2 and the clock signal CL1 sent through the input terminal 3 from the semiconductor tester 8, and an output signal is sent to the data input terminals D of the FIFO 7 and the FIFOs 71 to 73. The output signal of the DUT 6 is temporarily fetched in the FIFO 7 and the FIFOs 71 to 73 based on the clock signal CL1 sent to the input terminals INCLK of the FIFO 7 and the FIFOs 71 to 73. The output signal of the DUT 6 fetched in the FIFO 7 and the FIFOs 71 to 73 is outputted from the data output terminals Q based on the clock signal CL2 having a frequency which is equal to or lower than the maximum operating frequency of the semiconductor tester 8.

Accordingly, a difference in operation is made in that the output signal of the DUT 6 is sent from the FIFO 7 and the FIFOs 71 to 73 at the same time.

<B-3. Characteristic Function and Effect>

Thus, the output signal of the DUT 6 is temporarily fetched in the FIFO 7 and the FIFOs 71 to 73, and outputted with the timing of the clock signal CL2 which can give an optional cycle so that the DUT 6 having a 4-bit output can be tested at the practical operating frequency and the output signal of the DUT 6 can be observed, in the semiconductor tester 8, at a frequency which is equal to or lower than the maximum operating frequency.

Furthermore, the semiconductor device testing fixture 1B has a structure in which the FIFO module 10 is used to correspond to a multibit output. In the case where the DUT 6 having a 1-bit input and a 1-bit output is to be tested, the semiconductor device testing fixture 1B can have substantially the same structure as that of the semiconductor device testing fixture 1A shown in FIG. 1 by removing the FIFO module 10 from the connector 9. Consequently, the semiconductor device testing fixture can be used for another purpose so that the manufacturing cost thereof can be reduced. By removing the FIFO module 10 to be attached to another semiconductor device testing fixture, the FIFO module 10 can be shared so that the manufacturing cost of the fixture can be reduced.

While the semiconductor device testing fixture 1B shown in FIG. 3 has a structure in which the DUT 6 having a 4-bit output is mounted, it is apparent that the semiconductor device testing fixture 1B can also correspond to the case where a DUT whose output has 4 bits or more is mounted.

<C. Third Embodiment>

<C-1. Structure of Apparatus>

Figure 5:
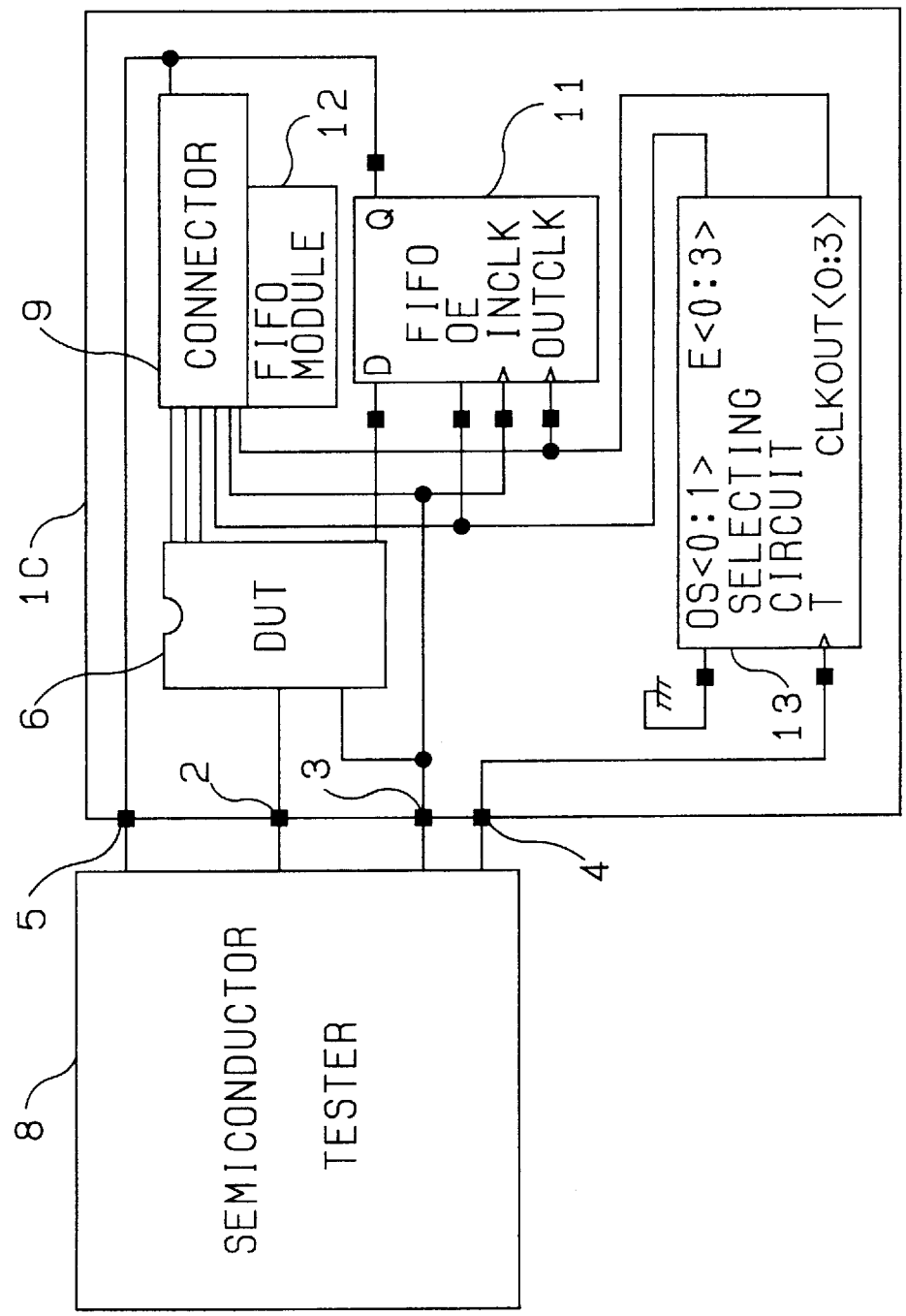
FIG. 5 is a block diagram for explaining the structure of a semiconductor device testing fixture according to a third embodiment of the present invention.

FIG. 5 shows the structure of a semiconductor device testing fixture 1C according to a third embodiment of the present invention.

In the semiconductor device testing fixture 1B which has been described with reference to FIGS. 3 and 4, the output of the DUT 6 has 4 bits and is sent from the semiconductor device testing fixture 1B to the semiconductor tester 8 at the same time. In the following, the multibit output of the DUT 6 is sent with a time difference to the semiconductor tester 8.

In FIG. 5, the DUT 6 is mounted on the semiconductor device testing fixture 1C, and the semiconductor tester 8 for testing the DUT 6 is connected to the semiconductor device testing fixture 1C.

The semiconductor device testing fixture 1C has input terminals 2, 3 and 4, and an output terminal 5 for receiving and sending a signal together with the semiconductor tester 8. On the semiconductor device testing fixture 1C are mounted a FIFO 11 having an output enable terminal OE, a FIFO module 12, and a selecting circuit 13 formed by a 4-bit counter circuit having an offset terminal. The selecting circuit 13 generates a signal based on a clock signal CL2 sent from the input terminal 4, and outputs the same signal from output terminals E <0> to <3> and clock output terminals CLKOUT <0> to <3>. Therefore, the selecting circuit 13 can be referred to as signal generating means.

In FIG. 5, the DUT 6 is connected to the input terminal 2 to which a test pattern is given from the semiconductor tester 8.

The DUT 6 and the FIFO 11, and a connector 9 of the FIFO module 12 are connected to the input terminal 3 to which a clock signal CL1 is sent from the semiconductor tester 8. The clock signal CL1 is sent to an input terminal INCLK in the FIFO 11.

The input terminal 4 is connected to an input terminal T of the selecting circuit 13 to which the clock signal CL2 is sent from the semiconductor tester 8. The clock output terminals CLKOUT <0> to <3> of the selecting circuit 13 are connected to an input terminal OUTCLK of the FIFO 11 and the connector 9. The output terminals E <0> to <3> of the selecting circuit 13 are connected to the output enable terminal OE of the FIFO 11 and the connector 9. A ground potential is given to two offset terminals OS <0> and <1> of the selecting circuit 13.

The output signal of the DUT 6 is sent to a data input terminal D of the FIFO 11 and the connector 9. A data output terminal Q of the FIFO 11 and the connector 9 are connected to the output terminal 5 in common.

Figure 6:
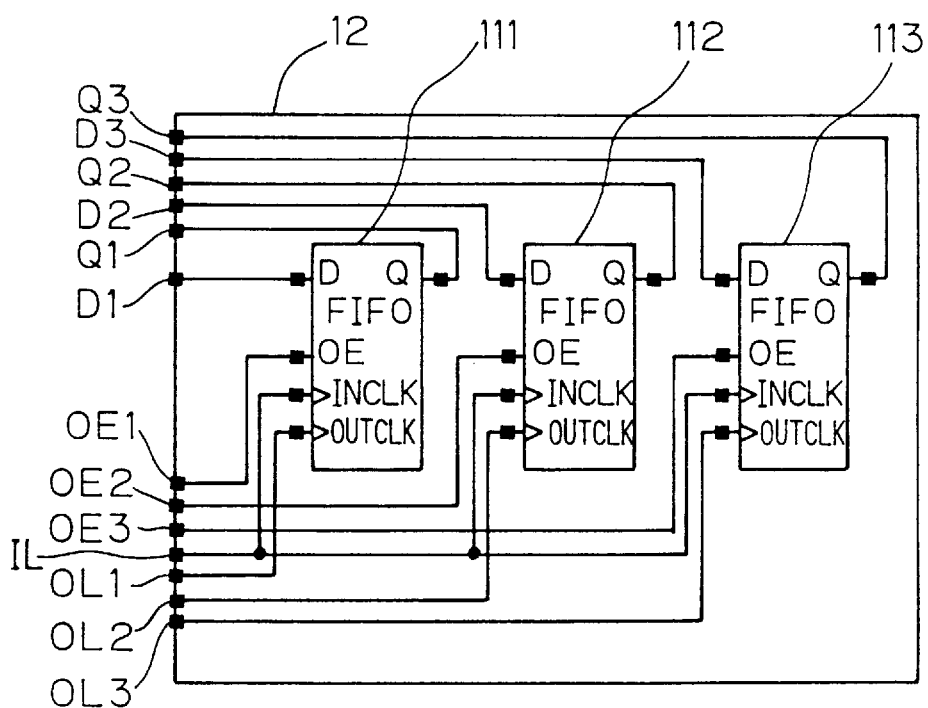
FIG. 6 is a block diagram for explaining the partial structure of the semiconductor device testing fixture according to the third embodiment of the present invention.

FIG. 6 shows the structure of the FIFO module 12. As shown in FIG. 6, FIFOs 111 to 113 which are identical to the FIFO 11 are mounted in the FIFO module 12.

Respective input terminals INCLK of the FIFOs 111 to 113 are connected to an external connecting terminal IL in common. Input terminals OUTCLK and output enable terminals OE of the FIFOs 111 to 113 are connected to external connecting terminals OL1 to OL3 and OE1 to OE3, respectively.

Data input terminals D and data output terminals Q of the FIFOs 111 to 113 are connected to external connecting terminals D1 to D3 and Q1 to Q3, respectively. The external connecting terminals IL, OL1 to OL3, OE1 to OE3, D1 to D3, and Q1 to Q3 are connected, through the connector 9, to the input terminal 3, the clock output terminals CLKOUT <1> to <3> of the selecting circuit 13, the output terminals E <1> to <3> of the selecting circuit 13, and the output terminal 5, respectively.

<C-2. Operation of Apparatus>

The operation of the semiconductor device testing fixture 1C will be described below with reference to FIGS. 7 to 9. First of all, the operation of a FIFO 11 unit will be described below with reference to FIG. 7.

The DUT 6 operates based on the test pattern given through the input terminal 2 and the clock signal CL1 sent through the input terminal 3 from the semiconductor tester 8. In this case, the clock signal CL1 is sent to the input terminal INCLK at a frequency which is equal to the practical operating frequency of the DUT 6. The DUT 6 outputs a signal for the result of operation performed at the practical operating frequency. The same output signal is sent to the data input terminals D of the FIFO 11 and the FIFOs 111 to 113 in the FIFO module 12.

The clock signal CL1 is sent to the input terminals INCLK of the FIFO 11 and the FIFOs 111 to 113 through the input terminal 3. As shown in FIG. 7, the output signal of the DUT 6 is temporarily fetched in the FIFO 7 with the timing of rise of the clock signal.

The clock signal CL2 is sent at a frequency which is equal to or lower than the maximum operating frequency of the semiconductor tester 8. While the output signal of the DUT 6 fetched in the FIFO 7 is being outputted from the data output terminal Q with the timing of rise of the clock signal CL2 as shown in FIG. 7, the signal can be outputted from the data output terminal Q only in the case where the output enable terminal OE is significant. In the case where a signal sent to the output enable terminal OE is not in the significant condition, the output of the data output terminal Q is inhibited so that the data output terminal Q is brought into the high-impedance condition.

Figure 7:
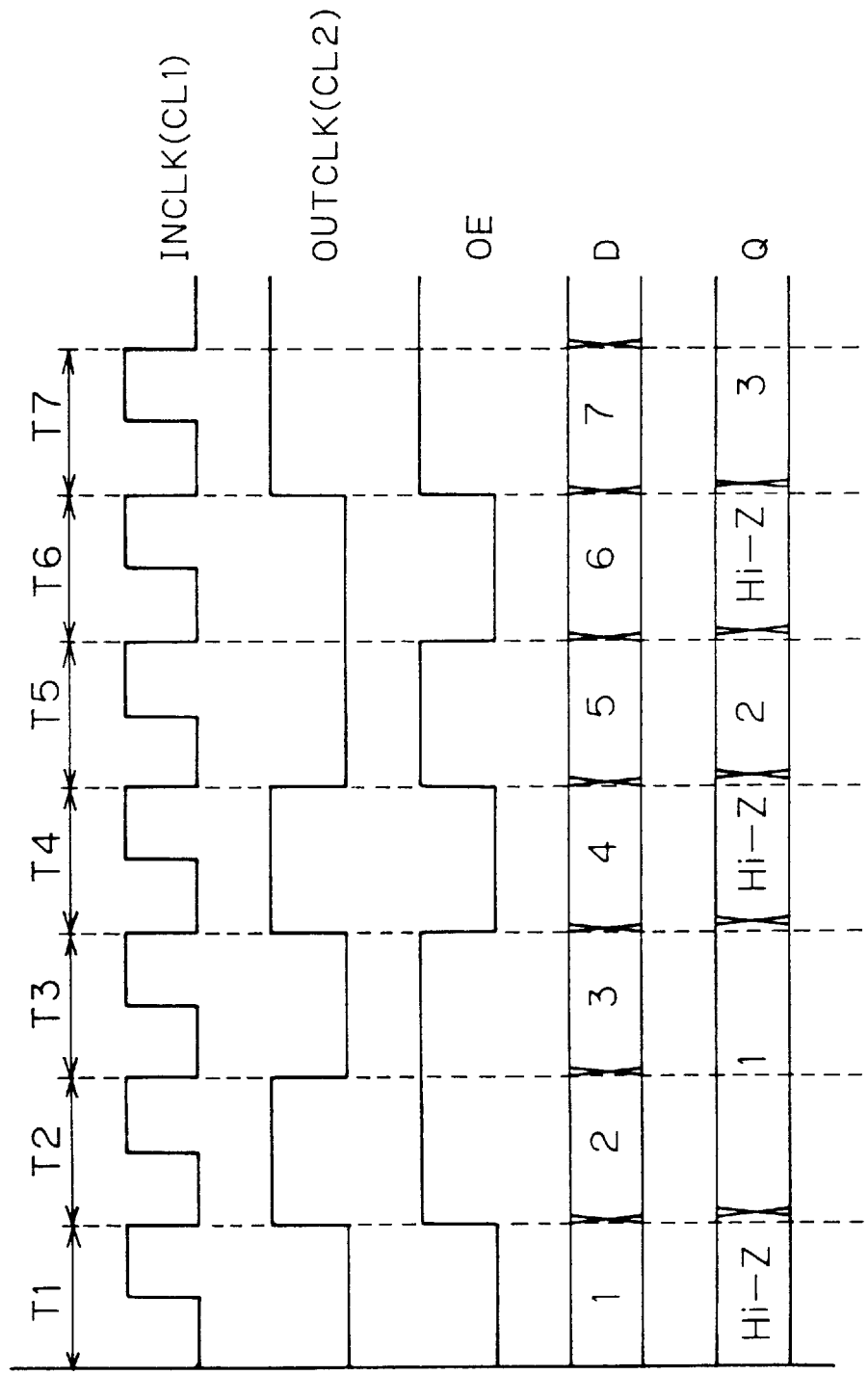
FIG. 7 is a timing chart for explaining the operation of the semiconductor device testing fixture according to the third embodiment of the present invention.

More specifically, first data fetched in a cycle T1 of the clock signal CL1 in FIG. 7 is outputted from the data output terminal Q with the timing of the first rise of the clock signal CL2 (the fall of the clock signal CL1 in the cycle T1). The reason is that the output enable terminal OE rises and is brought into the significant condition at the same time. The first data is continuously outputted while the output enable terminal OE is in the significant condition.

At the time of the second rise of the clock signal CL2 (the fall of the clock signal CL1 in a cycle T3), second data fetched in a cycle T2 of the clock signal CL1 should be outputted from the data output terminal Q. However, since the output enable terminal OE is not in the significant condition, the output of the data output terminal Q is inhibited so that the data output terminal Q is in the high-impedance condition. The output enable terminal OE is brought into the significant condition in a cycle T5 of the clock signal CL1. Consequently, the second data fetched in the cycle T2 is outputted from the data output terminal Q. However, since the output enable terminal OE is not in the significant condition in a cycle T6 of the clock signal CL1, the output of the data output terminal Q is inhibited so that the data output terminal Q is brought into the high-impedance condition.

The operation of the semiconductor device testing fixture 1C will be described below with reference to FIGS. 8 and 9. FIGS. 8 and 9 are connected to each other on the line AA'.

First of all, the test pattern and the clock signal CL1 are sent through the input terminals 2 and 3 from the semiconductor tester 8 to the DUT 6 respectively so as to cause the DUT 6 to operate.

The selecting circuit 13 is formed by a 4-bit counter circuit having an offset terminal. By the combination of the data to be given to the offset terminals OS <0> and <1>, consequently, it can be decided which of the FIFO 11 and the FIFOs 111 to 113 are selected.

For example, the following is decided. The case where the data given to the offset terminals OS <0> and <1> are 0, a selection number 0 is set to bring all the 4-bit outputs into the significant condition, the case where the data given to the offset terminals OS <0> and <1> are 0 and 1, a selection number 1 is set to bring the upper 3-bit output into the significant condition, the case where the data given to the offset terminals OS <0> and <1> are 1 and 0, a selection number 2 is set to bring the upper 2-bit output into the significant condition, and the case where the data given to the offset terminals OS <0> and <1> are 1, a selection number 3 is set to bring the upper 1-bit output into the significant condition.

Figure 8:
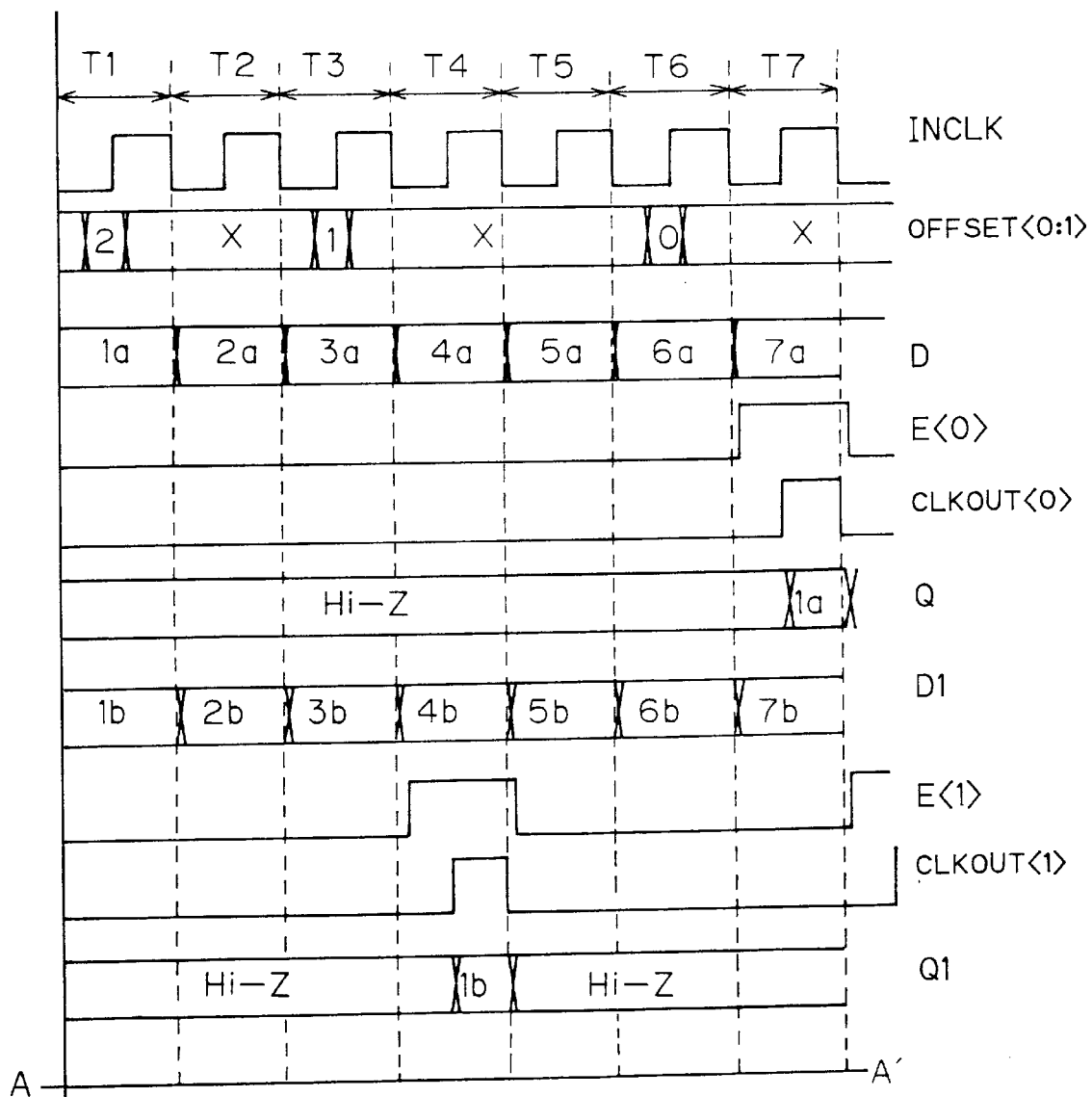
FIG. 8 is a timing chart for explaining the operation of the semiconductor device testing fixture according to the third embodiment of the present invention.
Figure 9:
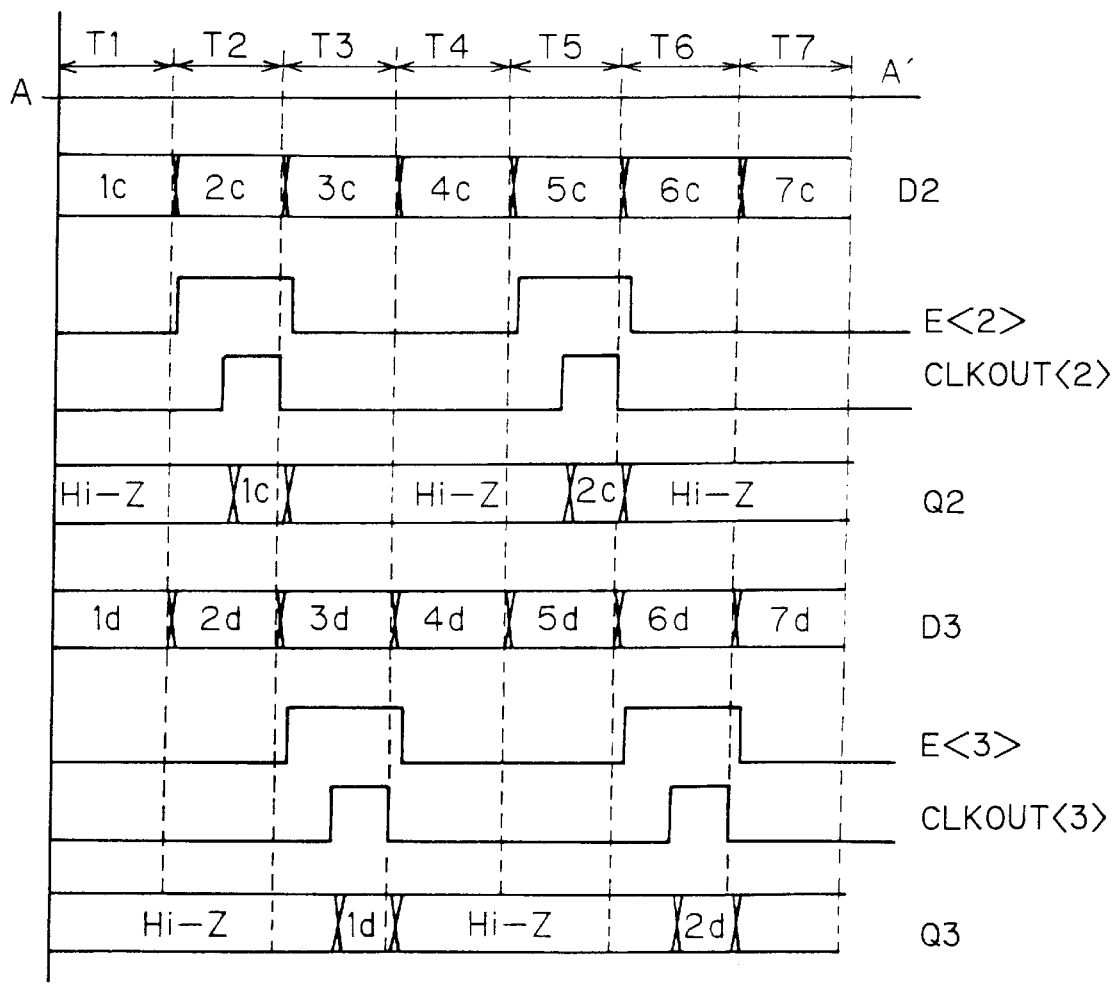
FIG. 9 is a timing chart for explaining the operation of the semiconductor device testing fixture according to the third embodiment of the present invention.

In FIGS. 8 and 9, predetermined data are sent to the offset terminals OS <0> and <1> in a cycle T1 of the clock signal CL1 to set the selection number 2, upper 2 bits of 4 bits are brought into the significant condition, and the FIFOs 112 and 113 in the FIFO module 12 are selected.

As shown in FIG. 9, if the output terminal E <2> and the clock output terminal CLKOUT <2> are brought into the significant condition in cycles T2 and T5 of the clock signal CL1, data 1c which is fetched in the FIFO 112 through the data input terminal D2 of the FIFO module 12 in the cycle T1 of the clock signal CL1 is outputted to the data output terminal Q2 of the FIFO module 12 and the data 2c which is fetched in the cycle T2 of the clock signal CL1 is outputted to the data output terminal Q2 of the FIFO module 12 in the cycle T5.

If the output terminal E <3> and the clock output terminal CLKOUT <3> are brought into the significant condition in cycles T3 and T6 of the clock signal CL1, data 1d which is fetched in the FIFO 113 through the data input terminal D3 of the FIFO module 12 in the cycle T1 of the clock signal CL1 is outputted to the data output terminal Q3 of the FIFO module 12 and data 2d which is fetched in the cycle T2 of the clock signal CL1 is outputted to the data output terminal Q3 of the FIFO module 12 in the cycle T6.

Accordingly, if the selection number is 2, signals outputted from the data output terminals Q2 and Q3 of the FIFO module 12 are sent to the output terminal 5. The signals outputted from the data output terminals Q2 and Q3 are sent with time differences, respectively. For this reason, the output signals are sent to the semiconductor tester 8 without competition with each other.

While the case where the selection number is 2 has been described above, FIGS. 8 and 9 also show the cases where the selection number is 1 and 0. However, the cycle of the clock signal CL1 which decides these selection numbers is different from that in the case where the selection number is 2. Consequently, the fetch cycle of data is also different. Accordingly, FIGS. 8 and 9 show the case where the selection number is 2, and do not correspond to the cases where the selection number is 1 and 0.

In the DUT test, the selection number is decided in advance. Accordingly, there is no case where the selection number is changed one after another during the test as shown in FIGS. 8 and 9. For example, FIG. 5 shows the structure in which a ground potential is given to the offset terminals OS <0> and <1>. In this case, the data given to the offset terminals OS <0> and <1> are 0 so that the selection number is 0. If all the DUTs to be tested are the same, it is not necessary to change the selection number.

In order to change the selection number, the data given to the offset terminals OS <0> and <1> should be changed. For this purpose, it is necessary to give data 1 to at least one of the offset terminals OS <0> and <1>. In that case, it is sufficient that the terminal is connected to a predetermined source potential. Furthermore, the offset terminals OS <0> and <1> may be connected to the predetermined terminals of the semiconductor tester 8 to optionally give 0 data or 1 data therefrom.

<C-3. Characteristic Function and Effect>

As described above, the outputs of a plurality of FIFOs which fetch the multibit output of the DUT 6 are exclusively selected, and the multibit output of the DUT 6 is sent with a time difference to the semiconductor tester 8. Consequently, the number of signal terminals of the semiconductor tester 8 can be reduced.

In the case where the number of the input terminals of the semiconductor tester 8 is smaller than that of the output terminals of the DUT 6, the batch of the outputs of the DUT 6 is sent so that the results of the test can be observed for all the outputs of the DUT 6.

<D. Fourth Embodiment>
<D-1. Structure of Apparatus>

Figure 10:
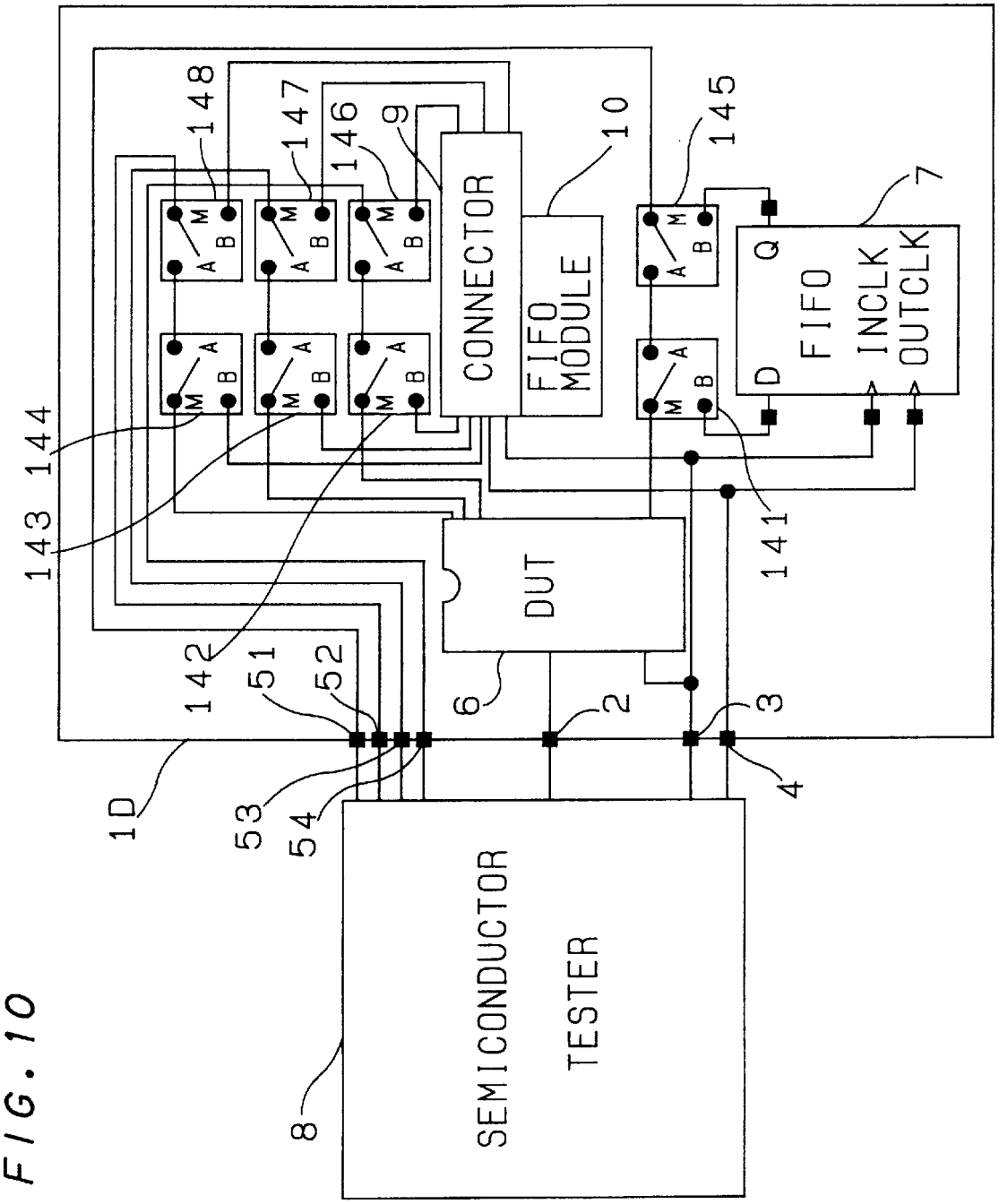
FIG. 10 is a block diagram for explaining the structure of a semiconductor device testing fixture according to a fourth embodiment of the present invention.

FIG. 10 shows the structure of a semiconductor device testing fixture 1D according to a fourth embodiment of the present invention.

While the structure in which the AC test of the DUT 6 is performed by using the semiconductor tester 8 has been described in the first to third embodiments, a structure in which the DC test of the DUT 6 can also be performed will be described below.

In FIG. 10, the DUT 6 having a 4-bit output is mounted on the semiconductor device testing fixture 1D, and a semiconductor tester 8 for testing the DUT 6 is connected to the semiconductor device testing fixture 1D.

The semiconductor device testing fixture 1D has input terminals 2, 3 and 4, and output terminals 51 to 54 for receiving and sending a signal together with the semiconductor tester 8. Furthermore, a FIFO 7, a FIFO module 10 and relay devices 141 to 148 are mounted on the semiconductor device testing fixture 1D.

In FIG. 10, the DUT 6 is connected to the input terminal 2 to which a test pattern is given from the semiconductor tester 8.

The DUT 6 and the FIFO 7, and a connector 9 of the FIFO module 10 are connected to the input terminal 3 to which a clock signal CL1 is sent from the semiconductor tester 8. The clock signal CL1 is sent to an input terminal INCLK in the FIFO 7.

The FIFO 7 and the connector 9 are connected to the input terminal 4 to which a clock signal CL2 is sent from the semiconductor tester 8. The clock signal CL2 is sent to an input terminal OUTCLK in the FIFO 7. Four outputs of the DUT 6 are connected to main terminals M of the relay devices 141 to 144, respectively.

Each of the relay devices 141 to 148 has two switching terminals A and B in addition to the main terminal M, and serves to switch a path for a signal sent to the main terminal M by connecting the main terminal M to the switching terminal A or B.

In FIG. 10, the switching terminal B of the relay device 141 is connected to a data input terminal D of the FIFO 7, and the switching terminals B of the relay devices 142 to 144 are connected to the connector 9 of the FIFO module 10.

The switching terminals A of the relay devices 141 to 144 are connected to those of the relay devices 145 to 148, respectively. The switching terminal B of the relay device 145 is connected to a data output terminal Q of the FIFO 7. The switching terminals B of the relay devices 146 to 148 are connected to the connector 9 of the FIFO module 10.

The main terminals M of the relay devices 145 to 148 are connected to the output terminals 51 to 54, respectively.

Since the structure of the FIFO module 10 has been described in the second embodiment with reference to FIG. 4, the repeated description will be omitted. The respective data input terminals D of FIFOs 71 to 73 are individually connected to external connecting terminals D1 to D3. The respective data output terminals Q of the FIFOs 71 to 73 are individually connected to external connecting terminals Q1 to Q3. The external connecting terminals D1 to D3 and Q1 to Q3 are connected, through the connector 9, to the switching terminals B of the relay devices 142 to 144 and those of the relay devices 146 to 148, respectively.

<D-2. Operation of Apparatus>

In the case where the AC test of the DUT 6 is performed by using the semiconductor device testing fixture 1D, all the main terminals M of the relay devices 141 to 148 are connected to the switching terminals B. Since the operation of the AC test is the same as in the semiconductor device testing fixture 1B described with reference to FIG. 3, the repeated description will be omitted.

In the case where the DC test of the DUT 6 is performed by using the semiconductor device testing fixture 1D, all the main terminals M of the relay devices 141 to 148 are connected to the switching terminals A so that the output signal of the DUT 6 is not sent to the FIFO 7 and the FIFOs 71 to 73 in the FIFO module 10 but is directly sent to the output terminals 51 to 54.

<D-3. Characteristic Function and Effect>

As described above, in the case where the semiconductor device testing fixture 1D is provided with the relay devices 141 to 148 to perform the DC test of the DUT 6, a signal path is switched so as to directly send the output signal of the DUT 6 to the semiconductor tester 8 without using the FIFO. Thus, it is possible to obtain the semiconductor device testing fixture which can be used for the DC test as well as the AC test.

When performing the DC test, the FIFO 7 and the FIFOs 71 to 73 in the FIFO module 10 are completely disconnected electrically from a path through which the output signal of the DUT 6 is sent by the relay devices 141 to 148. Consequently, it is possible to prevent the FIFO from becoming a load to change the output signal of the DUT 6. Thus, the test can be performed with high precision.

<E. Fifth Embodiment>
<E-1. Structure of Apparatus>

Figure 11:
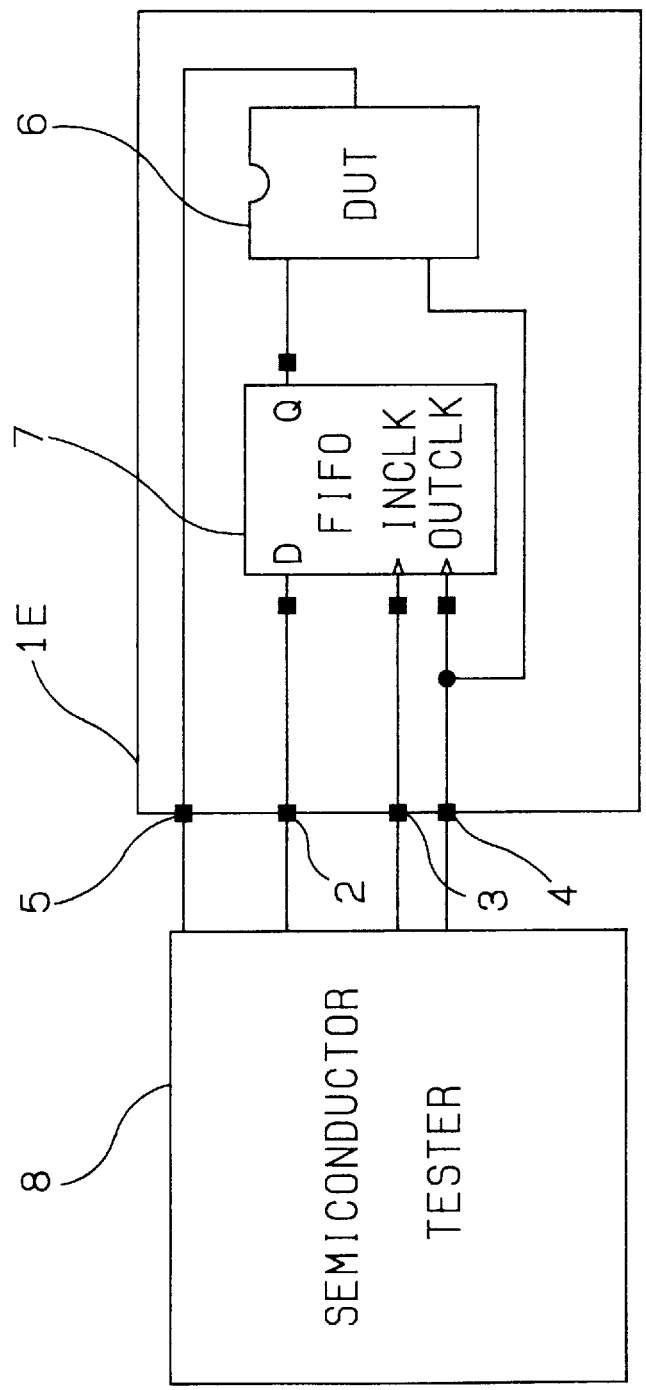
FIG. 11 is a block diagram for explaining the structure of a semiconductor device testing fixture according to a fifth embodiment of the present invention.

FIG. 11 shows the structure of a semiconductor device testing fixture 1E according to a fifth embodiment of the present invention.

The first to fourth embodiments have described the structure to solve a problem that the semiconductor tester 8 can generate an input signal having a frequency which is almost equal to the operating frequency of the DUT 6 but the observation of the output signal of the DUT 6 is restricted with the maximum test frequency of the semiconductor tester 8 if the output signal of the DUT 6 has a frequency which is almost equal to the practical operating frequency of the DUT 6 and is higher than the maximum test frequency intrinsic to the semiconductor tester 8. In the following, there will be described a structure to solve a problem that the DUT 6 cannot be caused to operate at the practical operating frequency in the case where the semiconductor tester 8 cannot generate an input signal having a frequency which is equal to the practical operating frequency of the DUT 6, that is, a test pattern.

In FIG. 11, the DUT 6 is mounted on the semiconductor device testing fixture 1E, and a semiconductor tester 8 for testing the DUT 6 is connected to the semiconductor device testing fixture 1E.

The semiconductor device testing fixture 1E has input terminals 2, 3 and 4, and an output terminal 5 for receiving and sending a signal together with the semiconductor tester 8. Furthermore, a FIFO 7 is mounted on the semiconductor device testing fixture 1E.

In FIG. 11, a data input terminal D of the FIFO 7 is connected to the input terminal 2 to which a test pattern is given from the semiconductor tester 8. An input terminal INCLK of the FIFO 7 is connected to the input terminal 3 to which a clock signal CL1 is sent from the semiconductor tester 8. An input terminal OUTCLK of the FIFO 7 and the DUT 6 are connected to the input terminal 4 to which a clock signal CL2 is sent from the semiconductor tester 8. The output signal of the DUT 6 is sent to the output terminal 5.

<E-2. Operation of Apparatus>

The operation of the semiconductor device testing fixture 1E will be described below. Since the operation of a FIFO 7 unit is the same as the operation described in the first embodiment with reference to FIG. 2, the repeated description will be omitted.

First of all, a test pattern is given from the semiconductor tester 8 to the data input terminal D of the FIFO 7 through the input terminal 2. A clock signal CL1 inputted from the semiconductor tester 8 through the input terminal 3 has a frequency which is equal to or lower than the maximum test frequency of the semiconductor tester 8 and is set equal to that of the test pattern inputted from the input terminal 2. Accordingly, the test pattern inputted from the input terminal 2 is temporarily fetched in the FIFO 7 based on the clock signal CL1.

When a predetermined quantity of test patterns are fetched in the FIFO 7, data are sequentially outputted from the data output terminal Q to the DUT 6 in order of fetch based on a clock signal CL2 inputted from the input terminal 4.

It is apparent that the timing with which the test pattern is fetched in the FIFO 7 may be identical to the timing of rise of the clock signal CL1 as shown in FIG. 2 or the timing with which the test pattern fetched in the FIFO 7 is outputted may be identical to the timing of rise of the clock signal CL2 as shown in FIG. 2.

The clock signal CL2 has a frequency which is equal to the practical operating frequency of the DUT 6. Accordingly, the DUT 6 operates at the practical operating frequency. As a result, the output signal is sent to the semiconductor tester 8 through the output terminal 5. In the DUT 6 to be tested, the output signal obtained by the operation at the practical operating frequency has a frequency which is equal to or lower than the maximum test frequency of the semiconductor tester 8. Therefore, there is no problem that the observation of the output signal of the DUT 6 is restricted with the maximum test frequency of the semiconductor tester 8.

<E-3. Characteristic Function and Effect>

As described above, the semiconductor device testing fixture 1E gives the test pattern from the semiconductor tester 8 to the data input terminal of the FIFO 7 through the input terminal 2, temporarily fetches the test pattern based on the clock signal CL1 having the frequency which is equal to or lower than the maximum test frequency of the semiconductor tester 8, and outputs the test pattern to the DUT 6 based on the clock signal CL2 having the frequency which is equal to the practical operating frequency of the DUT 6. Consequently, also in the case where the semiconductor tester 8 cannot generate an input signal having a frequency which is equal to the practical operating frequency of the DUT 6, that is, the test pattern, the DUT 6 can be caused to operate at the practical operating frequency.

<F. Sixth Embodiment>
<F-1. Structure of Apparatus>

Figure 12:
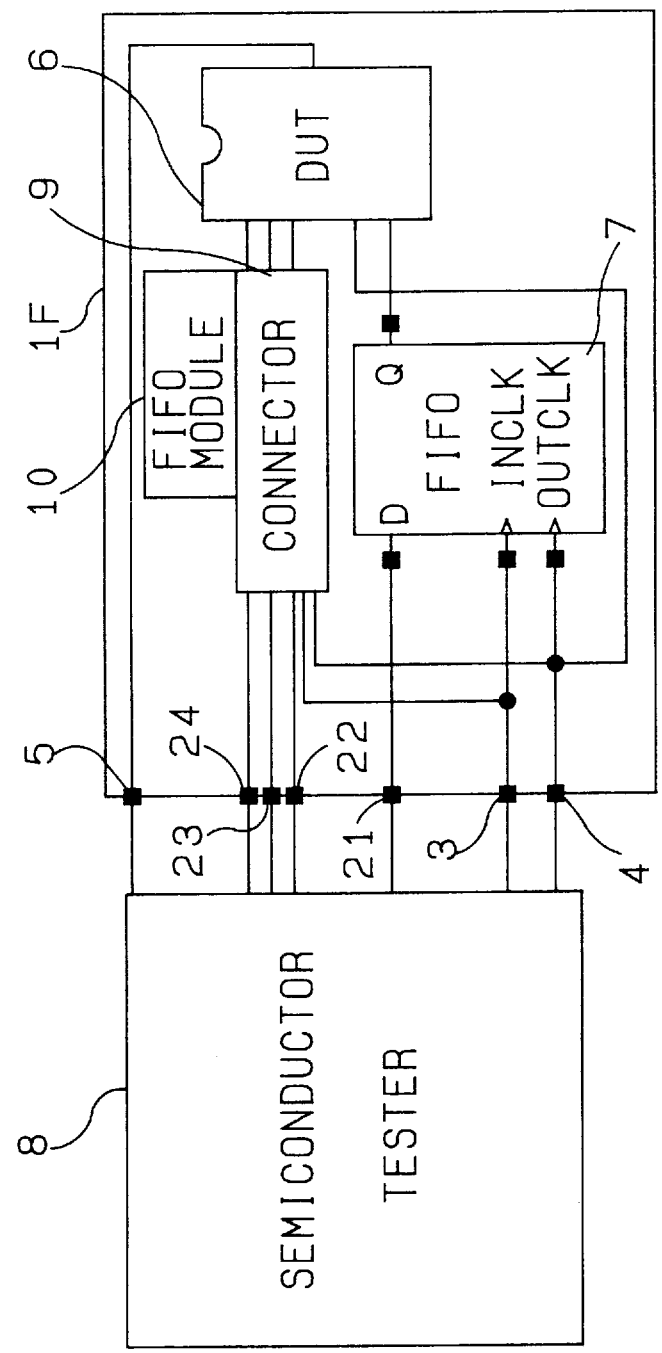
FIG. 12 is a block diagram for explaining the structure of a semiconductor device testing fixture according to a sixth embodiment of the present invention.

FIG. 12 shows the structure of a semiconductor device testing fixture 1F according to a sixth embodiment of the present invention.

While the output of the DUT 6 has 1 bit in the semiconductor device testing fixture 1E which has been described with reference to FIG. 11, the output of the DUT 6 has a multibit in the following.

In FIG. 12, the DUT 6 is mounted on the semiconductor device testing fixture 1F, and a semiconductor tester 8 for testing the DUT 6 is connected to the semiconductor device testing fixture 1F.

The semiconductor device testing fixture 1F has input terminals 21 to 24, 3 and 4, and an output terminal 5 for receiving and sending a signal together with the semiconductor tester 8. Furthermore, a FIFO 7 and a FIFO module 10 are mounted on the semiconductor device testing fixture 1F.

In FIG. 12, a data input terminal D of the FIFO 7 is connected to the input terminal 21 and a connector 9 of the FIFO module 10 is connected to the input terminals 22 to 24 to receive a test pattern from the semiconductor tester 8. An input terminal INCLK of the FIFO 7 and the connector 9 of the FIFO module 10 are connected to the input terminal 3 to which a clock signal CL1 is sent from the semiconductor tester 8. An input terminal OUTCLK of the FIFO 7 and the DUT 6 are connected to the input terminal 4 to which a clock signal CL2 is sent from the semiconductor tester 8.

A data output terminal Q of the FIFO 7 and the connector 9 of the FIFO module 10 are connected to the DUT 6. The output of the DUT 6 is connected to the output terminal 5.

Since the structure of the FIFO module 10 has been described with reference to FIG. 4, the repeated description will be omitted. External connecting terminals IL, OL, D1 to D3, and Q1 to Q3 of the FIFO module 10 are connected to the input terminals 3, 4 and 22 to 24, and the DUT 6 through the connector 9, respectively.

<F-2. Operation of Apparatus>

The operation of the semiconductor device testing fixture 1F is basically the same as that of the semiconductor device testing fixture 1E described with reference to FIG. 11. More specifically, a test pattern is given from the semiconductor tester 8 to the data input terminals D of the FIFO 7 and FIFOs 71 to 73 in the FIFO module 10 through the input terminals 21 to 24. The clock signal CL1 inputted from the semiconductor tester 8 through the input terminal 3 has a frequency which is equal to or lower than the maximum test frequency of the semiconductor tester 8 and is set equal to that of the test pattern inputted from the input terminals 21 to 24. Accordingly, the test patterns inputted from the input terminals 21 to 24 are temporarily fetched in the FIFO 7 and the FIFOs 71 to 73 based on the clock signal CL1.

When a predetermined quantity of test patterns are fetched in the FIFO 7 and the FIFOs 71 to 73, data are sequentially outputted from the respective data output terminals Q to the DUT 6 in order of fetch based on the clock signal CL2 inputted from the input terminal 4.

It is apparent that the timing with which the test pattern is fetched in the FIFO 7 may be identical to the timing of rise of the clock signal CL1 as shown in FIG. 2 or the timing with which the test pattern fetched in the FIFO 7 is outputted may be identical to the timing of rise of the clock signal CL2 as shown in FIG. 2.

The clock signal CL2 has a frequency which is equal to the practical operating frequency of the DUT 6. Accordingly, the DUT 6 operates at the practical operating frequency. As a result, the output signal is sent to the semiconductor tester 8 through the output terminal 5. In the DUT 6 to be tested, the output signal obtained by the operation at the practical operating frequency has a frequency which is equal to or lower than the maximum test frequency of the semiconductor tester 8. Therefore, there is no problem that the observation of the output signal of the DUT 6 is restricted with the maximum test frequency of the semiconductor tester 8.

<F-3. Characteristic Function and Effect>

Thus, the test pattern is given from the semiconductor tester 8 to the data input terminals of the FIFO 7 and the FIFOs 71 to 73 through the input terminals 21 to 24, is temporarily fetched based on the clock signal CL1 having a frequency which is equal to or lower than the maximum test frequency of the semiconductor tester 8, and is outputted to the DUT 6 based on the clock signal CL2 having a frequency which is equal to the practical operating frequency of the DUT 6. Consequently, also in the case where the semiconductor tester 8 cannot generate an input signal having a frequency which is equal to the practical operating frequency of the DUT 6, the DUT 6 can be caused to operate at the practical operating frequency.

Furthermore, the semiconductor device testing fixture 1F has a structure in which the FIFO module 10 is used to correspond to a multibit input. In the case where the DUT 6 to be tested has a 1-bit input, the semiconductor device testing fixture 1F can have substantially the same structure as that of the semiconductor device testing fixture 1E shown in FIG. 11 by removing the FIFO module 10 from the connector 9. Consequently, the semiconductor device testing fixture can be used for another purpose so that the manufacturing cost thereof can be reduced. By removing the FIFO module 10 to be attached to another semiconductor device testing fixture, the FIFO module 10 can be shared so that the manufacturing cost of the fixture can be reduced.

<G. Seventh Embodiment>
<G-1. Structure of Apparatus>

Figure 13:
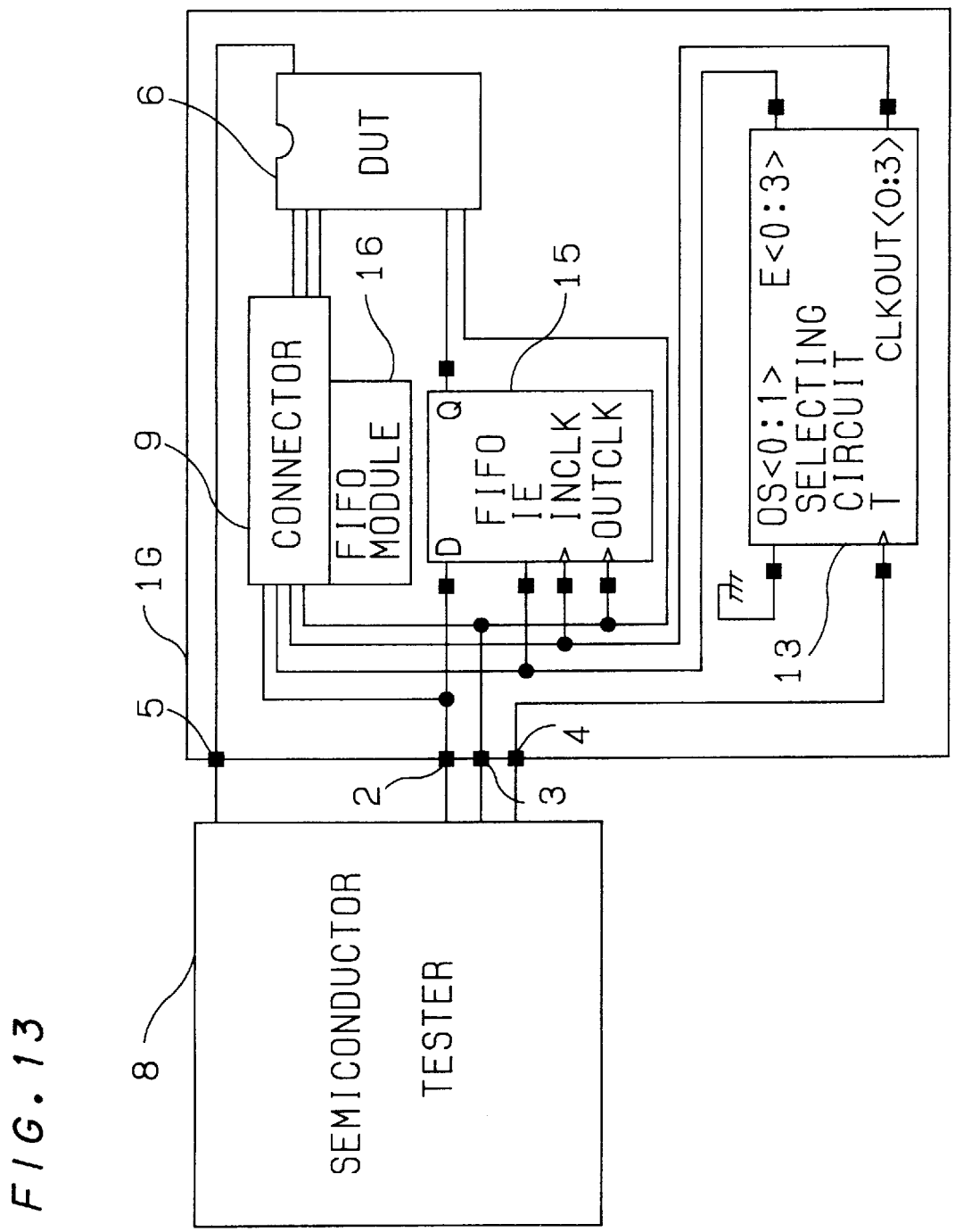
FIG. 13 is a block diagram for explaining the structure of a semiconductor device testing fixture according to a seventh embodiment of the present invention.

FIG. 13 shows the structure of a semiconductor device testing fixture 1G according to a seventh embodiment of the present invention.

In the semiconductor device testing fixture 1F which has been described with reference to FIG. 12, the output of the DUT 6 has 4 bits and is sent to the semiconductor tester 8 therefrom at the same time. In the following, the multibit output of the DUT 6 is sent with a time difference to a semiconductor tester 8.

In FIG. 13, the DUT 6 is mounted on the semiconductor device testing fixture 1G, and the semiconductor tester 8 for testing the DUT 6 is connected to the semiconductor device testing fixture 1G.

The semiconductor device testing fixture 1G has input terminals 2, 3 and 4, and an output terminal 5 for receiving and sending a signal together with the semiconductor tester 8. On the semiconductor device testing fixture 1G are mounted a FIFO 15 having an input enable terminal IE, a FIFO module 16, and a selecting circuit 13 formed by a 4-bit counter circuit having an offset terminal.

In FIG. 13, a data input terminal D of the FIFO 15 and a connector 9 of the FIFO module 16 are connected to the input terminal 2 to which a test pattern is given from the semiconductor tester 8.

An input terminal OUTCLK of the FIFO 15 and the connector 9, and the DUT 6 are connected to the input terminal 3 to which a clock signal CL1 is sent from the semiconductor tester 8.

An input terminal 4 is connected to an input terminal T of the selecting circuit 13 to which a clock signal CL2 is sent from the semiconductor tester 8. Four clock output terminals CLKOUT <0> to <3> of the selecting circuit 13 are connected to an input terminal INCLK of the FIFO 15 and the connector 9. Four output terminals E <0> to <3> of the selecting circuit 13 are connected to the input enable terminal IE of the FIFO 15 and the connector 9. A ground potential is given to two offset terminals OS <0> and <1> of the selecting circuit 13.

A data output terminal Q of the FIFO 15 and the connector 9 of the FIFO module 16 are connected to the DUT 6. The output of the DUT 6 is connected to the output terminal 5.

Figure 14:
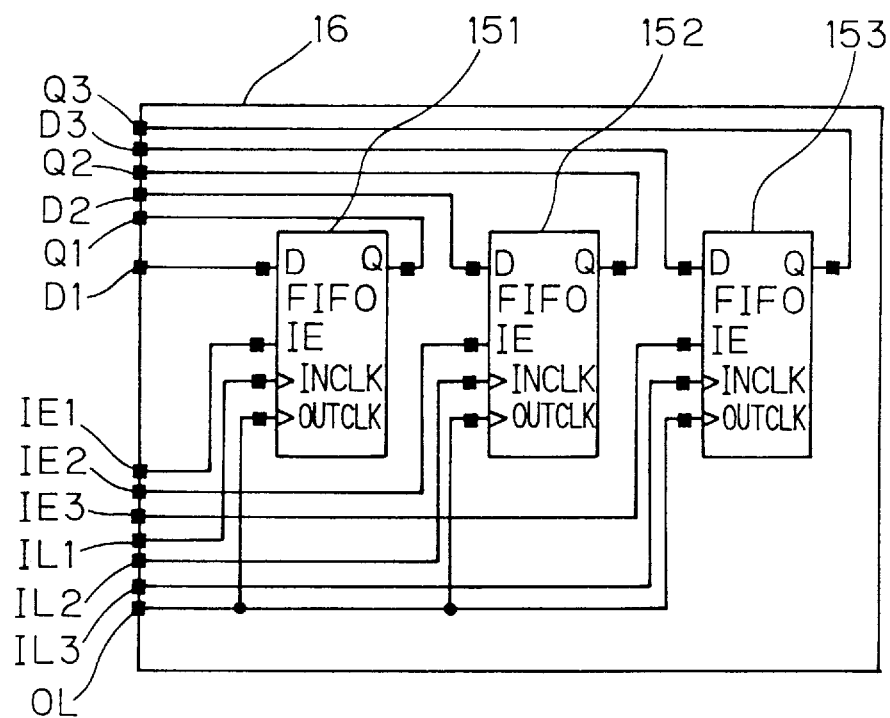
FIG. 14 is a block diagram for explaining the partial structure of the semiconductor device testing fixture according to the seventh embodiment of the present invention.

FIG. 14 shows the structure of the FIFO module 16. As shown in FIG. 14, FIFOs 151 to 153 which are identical to the FIFO 15 are mounted in the FIFO module 16.

Respective input terminals OUTCLK of the FIFOs 151 to 153 are connected to an external connecting terminal OL in common. Respective input terminals INCLK and input enable terminals IE of the FIFOs 151 to 153 are individually connected to external connecting terminals IL1 to IL3 and IE1 to IE3.

Data input terminals D and data output terminals Q of the FIFOs 151 to 153 are individually connected to external connecting terminals D1 to D3 and Q1 to Q3. The external connecting terminals OL, IL1 to IL3, IE1 to IE3, D1 to D3, and Q1 to Q3 are connected, through the connector 9, to the input terminal 3, the clock output terminals CLKOUT <1> to <3> of the selecting circuit 13, the output terminals E <1> to <3> of the selecting circuit 13, and the predetermined input terminals of the DUT 6, respectively.

<G-2. Operation of Apparatus>

The operation of the semiconductor device testing fixture 1G will be described below. First of all, the operation of a FIFO 11 unit will be described below with reference to FIG. 15.

Figure 15:
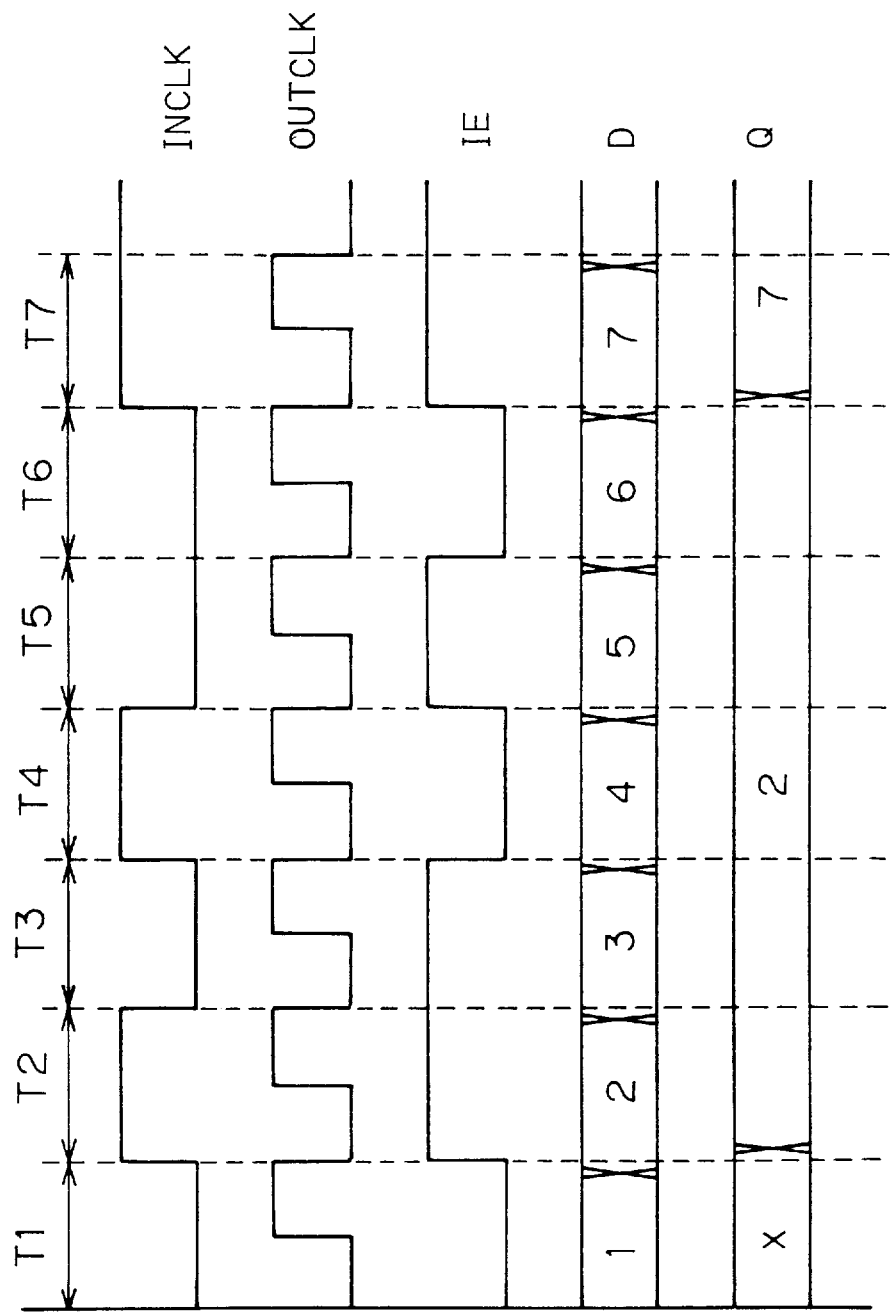
FIG. 15 is a timing chart for explaining the operation of the semiconductor device testing fixture according to the seventh embodiment of the present invention.

In FIG. 15, if the clock signal sent to the input terminal INCLK and the signal sent to the input enable terminal IE are significant, the data given to the data input terminal D are fetched and sequentially outputted to the data output terminal Q in order of fetch with the timing of rise of the clock signal sent to the input terminal OUTCLK.

For example, in a cycle T2 of the clock signal sent to the input terminal OUTCLK, the data on the data input terminal D fetched based on the timing of rise of the clock signal sent to the input terminal INCLK are outputted to the data output terminal Q because the signal sent to the input enable terminal IE is significant.

In a cycle T4, the data given to the data input terminal D are being fetched based on the timing of rise of the clock signal sent to the input terminal INCLK. However, fetch is inhibited because the signal sent to the input enable terminal IE is not significant.

In a cycle T7, the data on the data input terminal D fetched based on the timing of rise of the clock signal inputted to the input terminal INCLK are outputted to the data output terminal Q because the signal sent to the input enable terminal IE is significant. Accordingly, the data fetched in the cycle T2 are consecutively outputted until the cycle T7 and are updated in the cycle T7.

In the semiconductor device testing fixture 1G shown in FIG. 13, the test pattern inputted from the input terminal 2 by using a significant signal outputted from the selecting circuit 13 is exclusively fetched in the FIFO 15 and the FIFOs 151 to 153 in the FIFO module 16 through the connector 9.

Based on the clock signal CL1 inputted from the input terminal 3, the test pattern is outputted from the data output terminals Q of the FIFO 15 and the FIFOs 151 to 153 to the DUT 6. The clock signal CL1 has a frequency which is equal to the practical operating frequency of the DUT 6. Therefore, the DUT 6 is tested at the practical operating frequency.

<G-3. Characteristic Function and Effect>

Thus, the test pattern inputted from the input terminal 2 is exclusively fetched in the FIFO 15 and the FIFOs 151 to 153, and is given to the DUT 6 based on the clock signal CL1 having the frequency which is equal to the practical operating frequency of the DUT 6. Consequently, also in the case where the semiconductor tester 8 cannot generate an input signal having a frequency which is almost equal to the practical operating frequency of the DUT 6, the DUT 6 can be caused to operate at the practical operating frequency.

<H. Eighth Embodiment>

<H-1. Structure of Apparatus>

Figure 16:
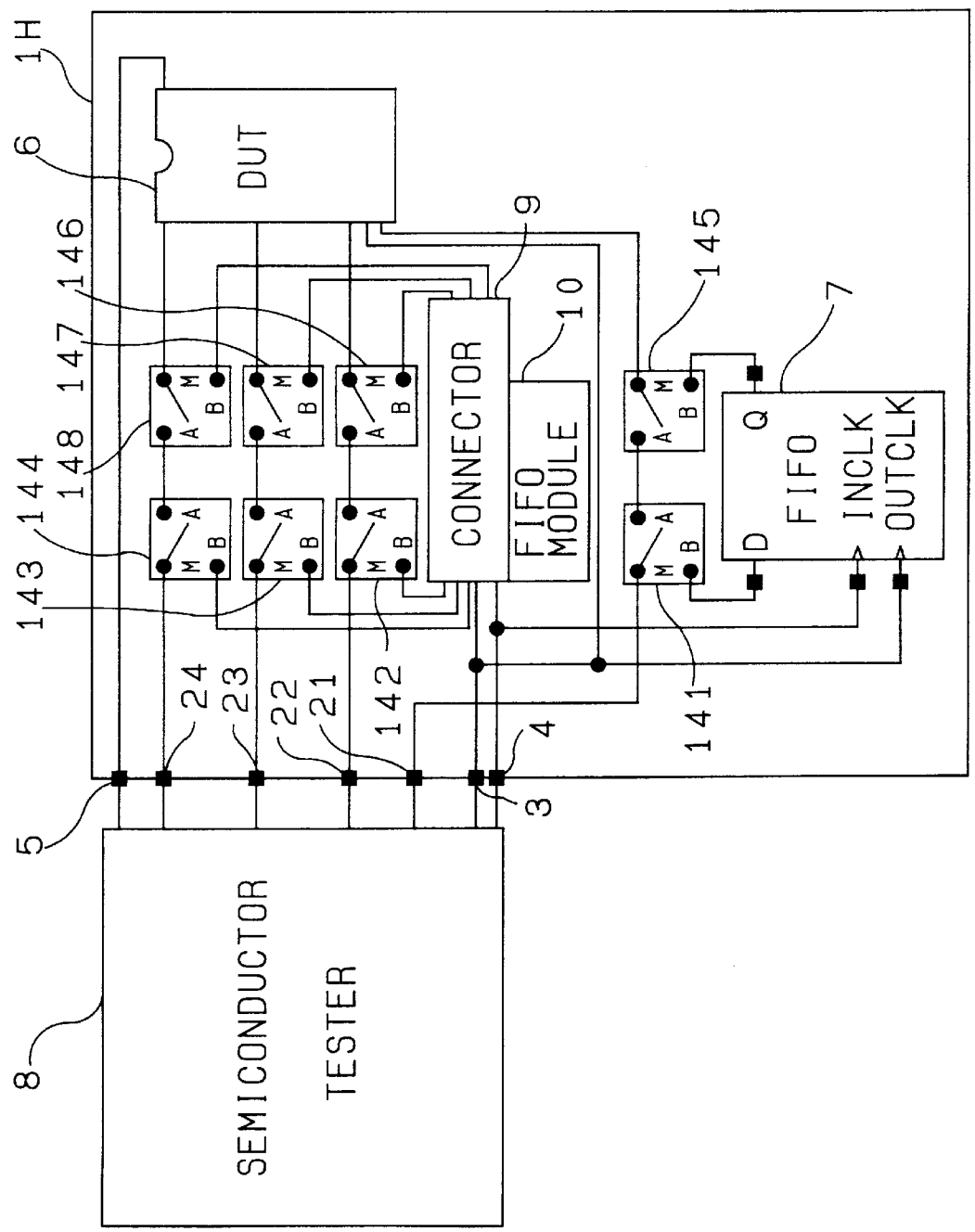
FIG. 16 is a block diagram for explaining the structure of a semiconductor device testing fixture according to an eighth embodiment of the present invention.

FIG. 16 shows the structure of a semiconductor device testing fixture 1H according to an eighth embodiment of the present invention.

While the structure in which the AC test of the DUT 6 is performed by using the semiconductor tester 8 has been described in the fifth to seventh embodiments, a structure in which the DC test of the DUT 6 is performed will be described below.

In FIG. 16, the DUT 6 having a 4-bit input is mounted on the semiconductor device testing fixture 1H, and a semiconductor tester 8 for testing the DUT 6 is connected to the semiconductor device testing fixture 1H.

The semiconductor device testing fixture 1H has input terminals 21 to 24, 3 and 4, and an output terminal 5 for receiving and sending a signal together with the semiconductor tester 8. Furthermore, a FIFO 7, a FIFO module 10 and relay devices 141 to 148 are mounted on the semiconductor device testing fixture 1H.

In FIG. 16, the input terminals 21 to 24 are connected to main terminals M of the relay devices 141 to 144 respectively to receive a test pattern from the semiconductor tester 8. Each of the relay devices 141 to 148 has two switching terminals A and B in addition to the main terminal M, and serves to switch a path for a signal sent to the main terminal M by connecting the main terminal M to the switching terminal A or B.

The DUT 6 and the FIFO 7, and a connector 9 of the FIFO module 10 are connected to the input terminal 3 to which a clock signal CL1 is sent from the semiconductor tester 8. The clock signal CL1 is sent to an input terminal OUTCLK in the FIFO 7.

The FIFO 7 and the connector 9 are connected to the input terminal 4 to which a clock signal CL2 is sent from the semiconductor tester 8. The clock signal CL2 is sent to an input terminal INCLK in the FIFO 7.

In FIG. 16, the switching terminal B of the relay device 141 is connected to a data input terminal D of the FIFO 7, and the switching terminals B of the relay devices 142 to 144 are connected to the connector 9 of the FIFO module 10.

The switching terminals A of the relay devices 141 to 144 are connected to those of the relay devices 145 to 148, respectively. The switching terminal B of the relay device 145 is connected to a data output terminal Q of the FIFO 7. The switching terminals B of the relay devices 146 to 148 are connected to the connector 9 of the FIFO module 10.

The main terminals M of the relay devices 145 to 148 are connected to the predetermined input terminals of the DUT 6, respectively. Furthermore, the output of the DUT 6 is connected to the output terminal 5.

Since the structure of the FIFO module 10 has been described in the second embodiment with reference to FIG. 4, the repeated description will be omitted. Respective data input terminals D of FIFOs 71 to 73 are individually connected to external connecting terminals D1 to D3. Respective data output terminals Q of the FIFOs 71 to 73 are individually connected to external connecting terminals Q1 to Q3. The external connecting terminals D1 to D3 and Q1 to Q3 are connected, through the connector 9, to the switching terminals B of the relay devices 142 to 144 and those of the relay devices 146 to 148, respectively.

The respective input terminals INCLK and OUTCLK of the FIFOs 71 to 73 are connected to external connecting terminals IL and OL in common. The external connecting terminals IL and OL are connected to the input terminals 4 and 3, respectively.

<H-2. Operation of Apparatus>

In the case where the AC test of the DUT 6 is performed by using the semiconductor device testing fixture 1H, all the main terminals M of the relay devices 141 to 148 are connected to the switching terminals B. Since the operation of the AC test is the same as in the semiconductor device testing fixture 1F described with reference to FIG. 12, the repeated description will be omitted.

In the case where the DC test of the DUT 6 is performed by using the semiconductor device testing fixture 1H, all the main terminals M of the relay devices 141 to 148 are connected to the switching terminals A so that the test patterns given from the input terminals 21 to 24 are not sent to the FIFO 7 and the FIFOs 71 to 73 in the FIFO module 10 but are directly sent to the DUT 6.

<H-3. Characteristic Function and Effect>

As described above, in the case where the semiconductor device testing fixture 1H is provided with the relay devices 141 to 148 to perform the DC test of the DUT 6, a signal path is switched so as to directly send the test pattern to the DUT 6 without using the FIFO. Thus, it is possible to obtain the semiconductor device testing fixture which can be used for the DC test as well as the AC test.

When performing the DC test, the FIFO 7 and the FIFOs 71 to 73 in the FIFO module 10 are completely disconnected electrically from a path through which the output signal of the DUT 6 is sent by the relay devices 141 to 148. Consequently, it is possible to prevent the FIFO from becoming a load to change the test pattern. Thus, the test can be performed with high precision.

<I. Ninth Embodiment>

<1-1. Structure of Apparatus>

Figure 17:
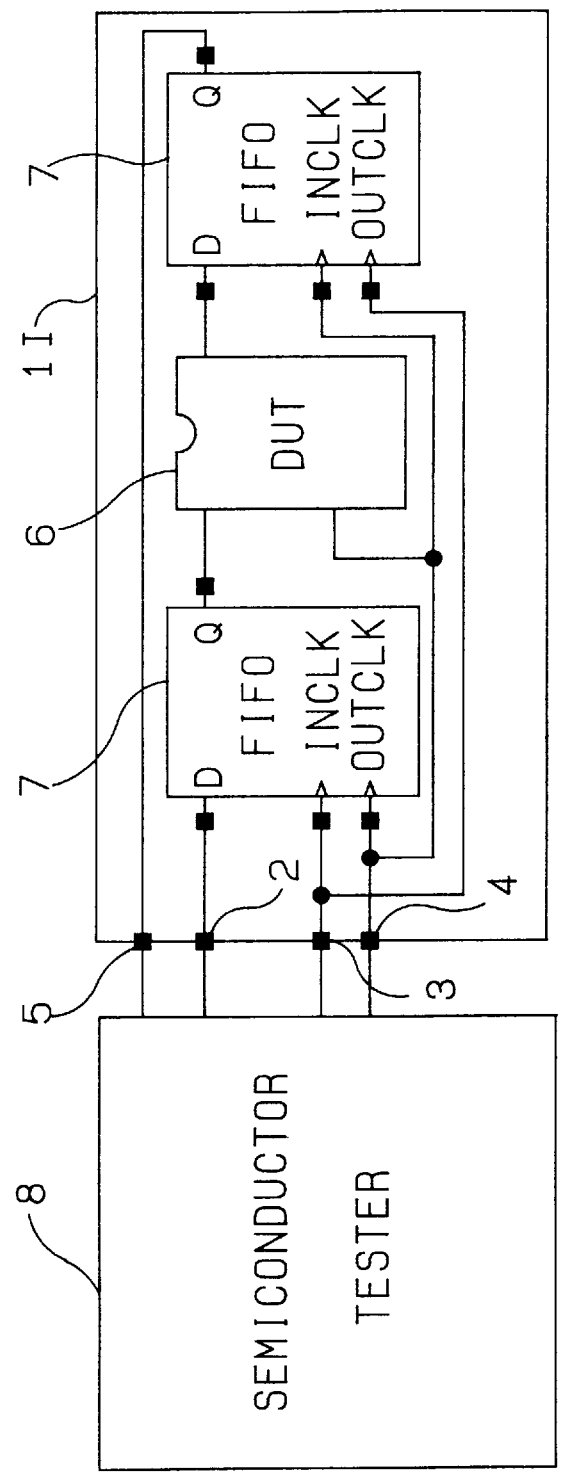
FIG. 17 is a block diagram for explaining the structure of a semiconductor device testing fixture according to a ninth embodiment of the present invention.

FIG. 17 shows the structure of a semiconductor device testing fixture 1I according to a ninth embodiment of the present invention.

The semiconductor device testing fixture 1I shown in FIG. 17 has a structure in which the semiconductor device testing fixture 1A described with reference to FIG. 1 is combined with the semiconductor device testing fixture 1E described with reference to FIG. 11.

In FIG. 17, a DUT 6 is mounted on the semiconductor device testing fixture 1I, and a semiconductor tester 8 for testing the DUT 6 is connected to the semiconductor device testing fixture 1I.

The semiconductor device testing fixture 1I has input terminals 2, 3 and 4, and an output terminal 5 for receiving and sending a signal together with the semiconductor tester 8. A FIFO 7 and a FIFO 7' which is identical to the FIFO 7 are mounted on the semiconductor device testing fixture 1I.

In FIG. 17, a data input terminal D of the FIFO 7 is connected to the input terminal 2 to which a test pattern is given from the semiconductor tester 8. An input terminal INCLK of the FIFO 7 and an input terminal OUTCLK of the FIFO 7' are connected to the input terminal 3 to which a clock signal CL1 is sent from the semiconductor tester 8. Furthermore, an input terminal OUTCLK of the FIFO 7 and the DUT 6, and an input terminal INCLK of the FIFO7' are connected to the input terminal 4 to which a clock signal CL2 is sent from the semiconductor tester 8. The output signal of the DUT 6 is sent to a data input terminal D of the FIFO 7'. A data output terminal Q of the FIFO 7' is connected to the output terminal 5.

<1-2. Operation of Apparatus>

The operation of the semiconductor device testing fixture 1I will be described below. Since the operation of FIFO 7 and 7' units is the same as the operation described in the first embodiment with reference to FIG. 2, the repeated description will be omitted.

First of all, a test pattern is given from the semiconductor tester 8 to the data input terminal D of the FIFO 7 through the input terminal 2. The clock signal CL1 inputted from the semiconductor tester 8 through the input terminal 3 has a frequency which is equal to or lower than the maximum test frequency of the semiconductor tester 8 and is set equal to that of the test pattern inputted from the input terminal 2. Accordingly, the test pattern inputted from the input terminal 2 is temporarily fetched in the FIFO 7 based on the clock signal CL1.

When a predetermined quantity of test patterns are fetched in the FIFO 7, data are sequentially outputted from the data output terminal Q to the DUT 6 in order of fetch based on the clock signal CL2 inputted from the input terminal 4.

The clock signal CL2 has a frequency which is equal to the practical operating frequency of the DUT 6. Accordingly, the DUT 6 is caused to operate at the practical operating frequency. As a result, an output signal is sent to the data input terminal D of the FIFO 7'.

The clock signal CL2 is sent to the input terminal INCLK of the FIFO 7' through the input terminal 4. The output signal of the DUT 6 is temporarily fetched in the FIFO 7' based on the clock signal CL2.

The clock signal CL2 has a frequency which is equal to the practical operating frequency of the DUT 6. For this reason, the output of the DUT 6 is fetched in the FIFO 7' at a frequency which is equal to the practical operating frequency. The clock signal CL1 is sent at a frequency which is equal to or lower than the maximum operating frequency of the semiconductor tester 8, and the output signal of the DUT 6 fetched in the FIFO 7' is outputted from the data output terminal Q based on the clock signal CL1. The order of output is identical to that of fetch.

<1-3. Characteristic Function and Effect>

As described above, the semiconductor device testing fixture 1I gives the test pattern from the semiconductor tester 8 to the data input terminal of the FIFO 7 through the input terminal 2, temporarily fetches the test pattern based on the clock signal CL1 having the frequency which is equal to or lower than the maximum test frequency of the semiconductor tester 8, and outputs the test pattern to the DUT 6 based on the clock signal CL2 having the frequency which is equal to the practical operating frequency of the DUT 6. Consequently, also in the case where the semiconductor tester 8 cannot generate an input signal having a frequency which is equal to the practical operating frequency of the DUT 6, the DUT 6 can be caused to operate at the practical operating frequency.

Furthermore, the output signal of the DUT 6 is fetched in the FIFO 7' based on the clock signal CL2 and is outputted with the timing of the clock signal CL1 which can give an optional cycle so that the output signal of the DUT 6 can be observed at a frequency which is equal to or lower than the maximum operating frequency in the semiconductor tester 8.

<J. Tenth Embodiment>
<J-1. Structure of Apparatus>

Figure 18:
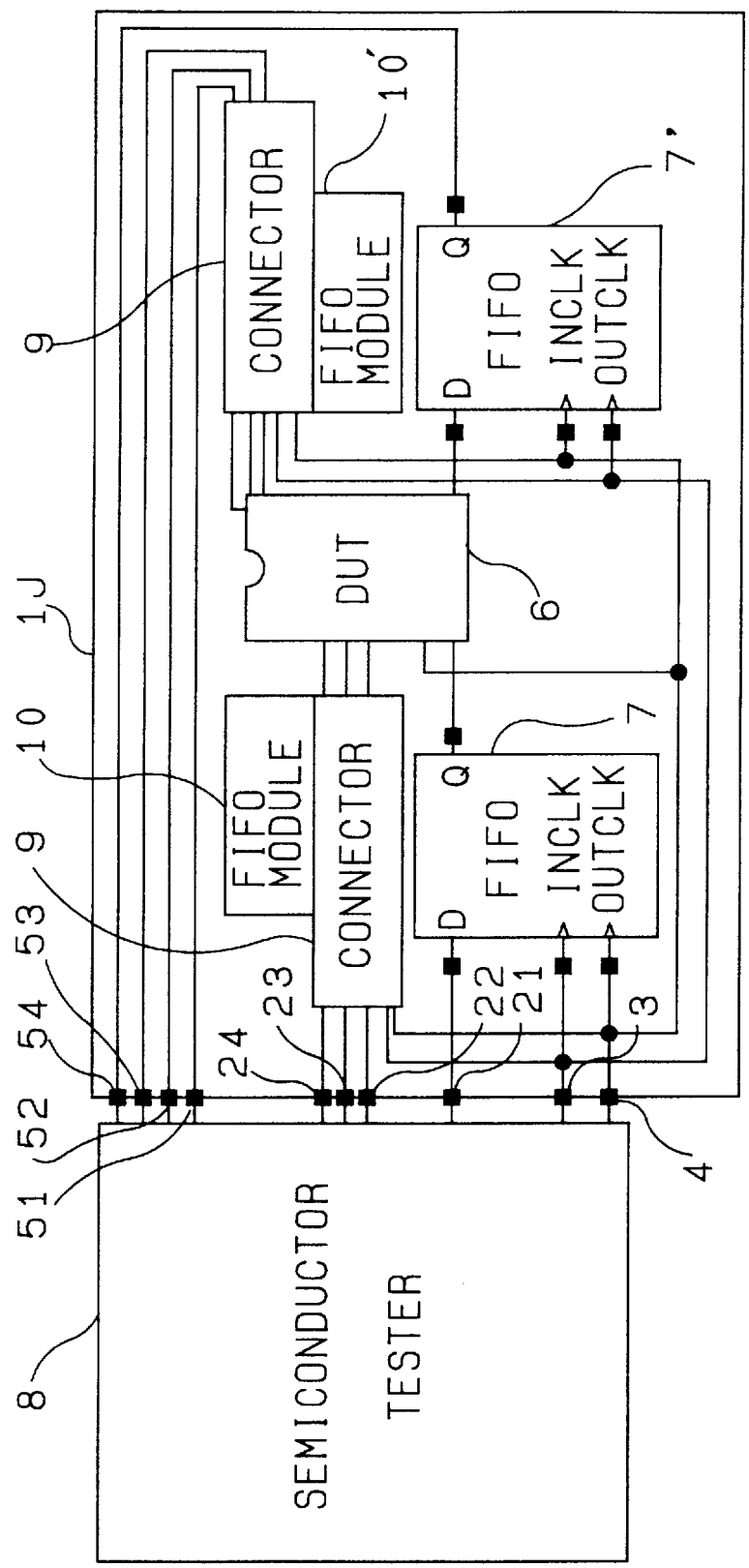
FIG. 18 is a block diagram for explaining the structure of a semiconductor device testing fixture according to a tenth embodiment of the present invention.

FIG. 18 shows the structure of a semiconductor device testing fixture 1J according to a tenth embodiment of the present invention.

The semiconductor device testing fixture 1J shown in FIG. 18 has a structure in which the semiconductor device testing fixture 1B described with reference to FIG. 3 is combined with the semiconductor device testing fixture 1F described with reference to FIG. 12.

In FIG. 18, a DUT 6 is mounted on the semiconductor device testing fixture 1J, and a semiconductor tester 8 for testing the DUT 6 is connected to the semiconductor device testing fixture 1J.

The semiconductor device testing fixture 1J has input terminals 21 to 24, 3 and 4, and output terminals 51 to 54 for receiving and sending a signal together with the semiconductor tester 8. FIFOs 7 and 7', a FIFO module 10, and a FIFO module 10' which is identical to the FIFO module 10 are mounted on the semiconductor device testing fixture 1J.

In FIG. 18, a data input terminal D of the FIFO 7 is connected to the input terminal 21 and a connector 9 of the FIFO module 10 is connected to the input terminals 22 to 24 to receive a test pattern from the semiconductor tester 8. Input terminals INCLK and OUTCLK of the FIFOs 7 and 7' are connected to the input terminal 3 respectively, and the connectors 9 of the FIFO modules 10 and 10' are connected to the input terminal 3 to receive a clock signal CL1 from the semiconductor tester 8. Furthermore, the input terminals OUTCLK and INCLK of the FIFOs 7 and 7' are connected to the input terminal 4 respectively, and the connectors 9 of the FIFO modules 10 and 10' and the DUT 6 are connected to the input terminal 4 to receive a clock signal CL2 from the semiconductor tester 8.

The data output terminal Q of the FIFO 7 and the connector 9 of the FIFO module 10 are connected to the predetermined input terminals of the DUT 6. The output of the DUT 6 is connected to a data input terminal D of the FIFO 7' and the connector 9 of the FIFO module 10'.

A data output terminal Q of the FIFO 7' and the connector 9 are connected to the output terminals 51 to 54.

Since the structures of the FIFO modules 10 and 10' have been described with reference to FIG. 4, the repeated description will be omitted. External connecting terminals IL, OL, D1 to D3, and Q1 to Q3 of the FIFO module 10 are connected to the input terminals 3, 4, and 22 to 24, and the DUT 6 through the connector 9, respectively. External connecting terminals IL, OL, D1 to D3, and Q1 to Q3 of the FIFO module 10' are connected to the input terminals 4 and 3, the DUT 6, and the output terminals 52 to 54 through the connector 9, respectively.

<J-2. Operation of Apparatus>

The operation of the semiconductor device testing fixture 1J will be described below. A test pattern is given from the semiconductor tester 8 to the data input terminals D of the FIFO 7 and the FIFOs 71 to 73 in the FIFO module 10 through the input terminals 21 to 24. A clock signal CL1 inputted from the semiconductor tester 8 through the input terminal 3 has a frequency which is equal to or lower than the maximum test frequency of the semiconductor tester 8 and is set equal to that of the test pattern inputted from the input terminals 21 to 24. Accordingly, the test patterns inputted from the input terminals 21 to 24 are temporarily fetched in the FIFO 7 and the FIFOs 71 to 73 based on the clock signal CL1.

When a predetermined quantity of test patterns are fetched in the FIFO 7 and the FIFOs 71 to 73, data are sequentially outputted from the data output terminal Q to the DUT 6 in order of fetch based on the clock signal CL2 inputted from the input terminal 4.

The clock signal CL2 has a frequency which is equal to the practical operating frequency of the DUT 6. Accordingly, the DUT 6 is caused to operate at the practical operating frequency. As a result, the output signal is sent to the data input terminals D of the FIFO 7' and the FIFOs 71 to 73 in the FIFO module 10'. The output signal of the DUT 6 is temporarily fetched in the FIFO 7' and the FIFOs 71 to 73 based on the clock signal CL2 sent to the input terminals INCLK of the FIFO 7' and the FIFOs 71 to 73. The output signal of the DUT 6 fetched in the FIFO 7' and the FIFOs 71 to 73 is sent from the data output terminals Q to the output terminals 51 to 54 based on the clock signal CL1 having a frequency which is equal to or lower than the maximum operating frequency of the semiconductor tester 8.

<J-3. Characteristic Function and Effect>

Thus, the test pattern is given from the semiconductor tester 8 to the data input terminals of the FIFO 7 and the FIFOs 71 to 73 in the FIFO module 10 through the input terminals 21 to 24, is temporarily fetched based on the clock signal CL1 having the frequency which is equal to or lower than the maximum test frequency of the semiconductor tester 8, and is outputted to the DUT 6 based on the clock signal CL2 having the frequency which is equal to the practical operating frequency of the DUT 6. Consequently, also in the case where the semiconductor tester 8 cannot generate an input signal having a frequency which is equal to the practical operating frequency of the DUT 6, the DUT 6 can be caused to operate at the practical operating frequency.

Furthermore, the output signal of the DUT 6 is temporarily fetched in the FIFO 7' and the FIFOs 71 to 73 in the FIFO module 10' and is outputted with the timing of the clock signal CL1 which can give an optional cycle so that the DUT 6 having a 4-bit output can be tested at the practical operating frequency. Thus, the output signal of the DUT 6 can be observed at a frequency which is equal to or lower than the maximum operating frequency in the semiconductor tester 8.

<K. Eleventh Embodiment>
<K-1. Structure of Apparatus>

Figure 19:
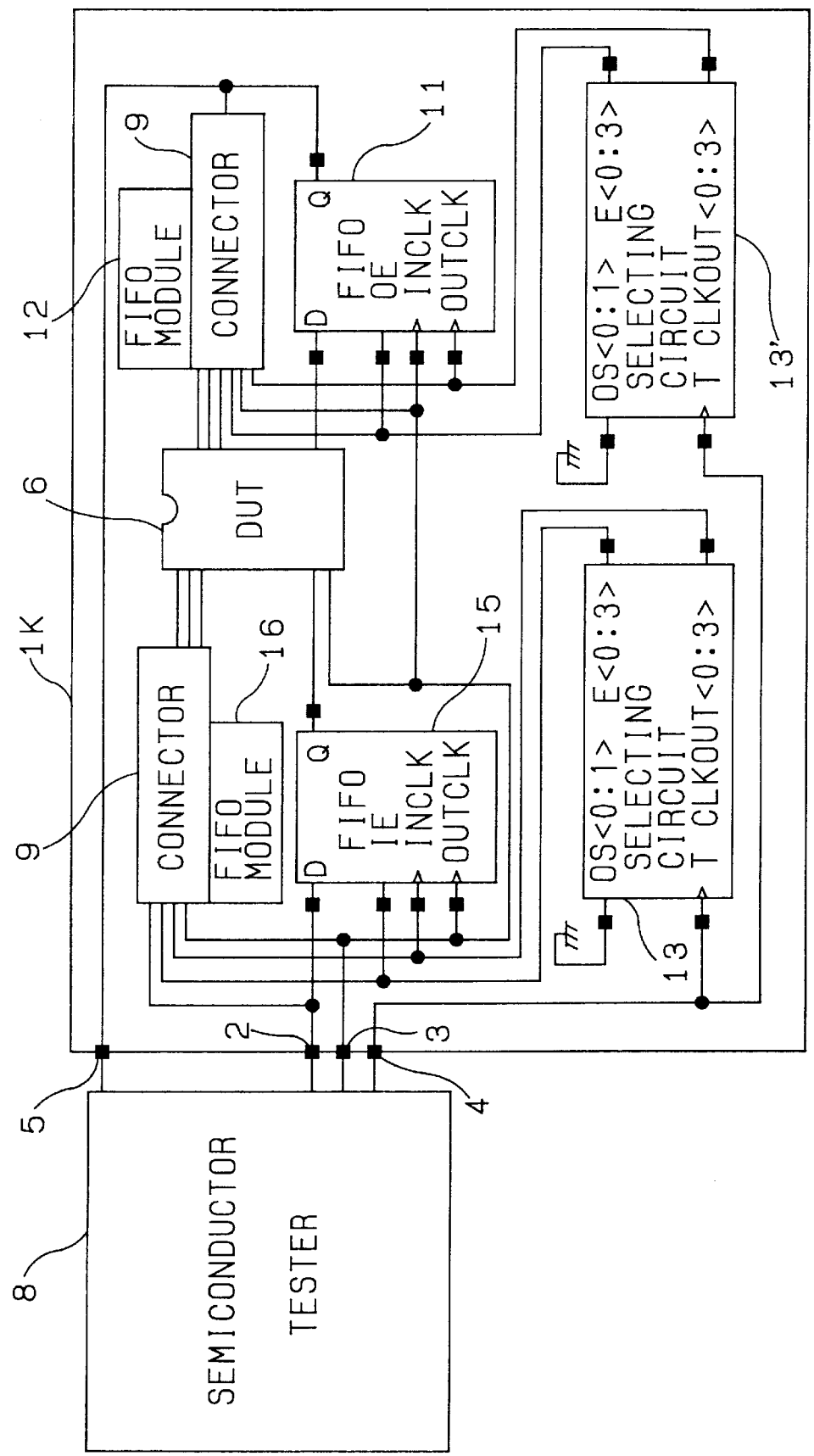
FIG. 19 is a block diagram for explaining the structure of a semiconductor device testing fixture according to an eleventh embodiment of the present invention.

FIG. 19 shows the structure of a semiconductor device testing fixture 1K according to an eleventh embodiment of the present invention.

The semiconductor device testing fixture 1K shown in FIG. 19 has a structure in which the semiconductor device testing fixture 1C described with reference to FIG. 5 is combined with the semiconductor device testing fixture 1G described with reference to FIG. 13.

In FIG. 19, a DUT 6 is mounted on the semiconductor device testing fixture 1K, and a semiconductor tester 8 for testing the DUT 6 is connected to the semiconductor device testing fixture 1K.

The semiconductor device testing fixture 1K has input terminals 2, 3 and 4, and an output terminal 5 for receiving and sending a signal together with the semiconductor tester 8. On the semiconductor device testing fixture 1K are mounted a FIFO 15 having an input enable terminal, a FIFO module 16, a FIFO 11 having an output enable terminal, a FIFO module 12, a selecting circuit 13 formed by a 4-bit counter circuit having an offset terminal, and a selecting circuit 13' which is identical to the selecting circuit 13.

In FIG. 19, a data input terminal D of the FIFO 15 and a connector 9 of the FIFO module 16 are connected to the input terminal 2 to which a test pattern is given from the semiconductor tester 8.

An input terminal OUTCLK of the FIFO 15, the connector 9 of the FIFO module 16, an input terminal INCLK of the FIFO 11 and the connector 9 of the FIFO module 12, and the DUT 6 are connected to the input terminal 3 to which a clock signal CL1 is sent from the semiconductor tester 8.

The input terminal 4 is connected to input terminals T of the selecting circuits 13 and 13' to which a clock signal CL2 is sent from the semiconductor tester 8. Four clock output terminals CLKOUT <0> to <3> of the selecting circuit 13 are connected to an input terminal INCLK of the FIFO 15 and the connector 9. Four output terminals E <0> to <3> of the selecting circuit 13 are connected to the input enable terminal IE of the FIFO 15 and the connector 9. A ground potential is given to two offset terminals OS <0> and <1> of the selecting circuit 13.

Four clock output terminals CLKOUT <0> to <3> of the selecting circuit 13' are connected to an input terminal OUTCLK of the FIFO 11 and the connector 9. Four output terminals E <0> to <3> of the selecting circuit 13 are connected to an output enable terminal OE of the FIFO 11 and the connector 9. A ground potential is given to two offset terminals OS <0> and <1> of the selecting circuit 13'.

A data output terminal Q of the FIFO 15 and the connector 9 of the FIFO module 16 are connected to the predetermined input terminals of the DUT 6. The output of the DUT 6 is connected to a data input terminal D of the FIFO 11 and the connector 9 of the FIFO module 12. A data output terminal Q of the FIFO 11 and the connector 9 of the FIFO module 12 are connected to the output terminal 5.

While the same structures as those of the semiconductor device testing fixture 1C described with reference to FIG. 5 and the semiconductor device testing fixture 1G described with reference to FIG. 13 have the same reference numerals and the repeated description will be omitted, external connecting terminals OL, IL1 to IL3, IE1 to IE3, D1 to D3, and Q1 to Q3 of the FIFO module 16 are connected, through the connector 9, to the input terminal 3, the clock output terminals CLKOUT <1> to <3> of the selecting circuit 13, the output terminals E <1> to <3> of the selecting circuit 13, the input terminal 2, and the predetermined input terminals of the DUT 6, respectively.

External connecting terminals IL, OL1 to OL3, OE1 to OE3, D1 to D3, and Q1 to Q3 of the FIFO module 12 are connected, through the connector 9, to the input terminal 3, the clock output terminals CLKOUT <1> to <3> of the selecting circuit 13, the output terminals E <1> to <3> of the selecting circuit 13, and the output terminal 5, respectively.

<K-2. Operation of Apparatus>

The operation of the semiconductor device testing fixture 1K will be described below. A test pattern inputted from the input terminal 2 by using a significant signal outputted from the selecting circuit 13 is exclusively fetched in the FIFO 15 and the FIFOs 151 to 153 in the FIFO module 16 through the connector 9.

Based on the clock signal CL1 inputted from the input terminal 3, the test pattern is outputted from the respective data output terminals Q of the FIFO 15 and the FIFOs 151 to 153 to the DUT 6. Since the clock signal CL1 has a frequency which is equal to the practical operating frequency of the DUT 6, the DUT 6 is tested at the practical operating frequency. Furthermore, the clock signal CL2 sent from the input terminal 4 is sent at a frequency which is equal to or lower than the maximum test frequency of the semiconductor tester 8.

Subsequently, the output of the DUT 6 is fetched in the FIFO 11 and the FIFOs 111 to 113 in the FIFO module 12 through the connector 9 based on the clock signal CL1 inputted from the input terminal 3. The output of the DUT 6 thus fetched is exclusively outputted from the respective data output terminals Q of the FIFO 11 and the FIFOs 111 to 113 by using a significant signal outputted from the selecting circuit 13'.

The signals outputted from the data output terminals Q2 and Q3 are sent with time differences, respectively. For this reason, the output signals are sent to the semiconductor tester 8 without competition with each other.

<K-3. Characteristic Function and Effect>

Thus, the test pattern inputted from the input terminal 2 is exclusively fetched in the FIFO 15 and the FIFOs 151 to 153, and are given to the DUT 6 based on the clock signal CL1 having the frequency which is equal to the practical operating frequency of the DUT 6. Consequently, also in the case where the semiconductor tester 8 cannot generate an input signal having a frequency which is equal to the practical operating frequency of the DUT 6, the DUT 6 can be caused to operate at the practical operating frequency.

Furthermore, the outputs of a plurality of FIFOs which fetch the multibit output of the DUT 6 are exclusively selected, and the multibit-output of the DUT 6 is sent with a time difference to the semiconductor tester 8. Consequently, the number of signal terminals of the semiconductor tester 8 can be reduced.

In the case where the number of the input terminals of the semiconductor tester 8 is smaller than that of the output terminals of the DUT 6, the batch of the outputs of the DUT 6 is sent so that the results of the test can be observed for all the outputs of the DUT 6.

<L. Twelfth Embodiment>
<L-1. Structure of Apparatus>

Figure 20:
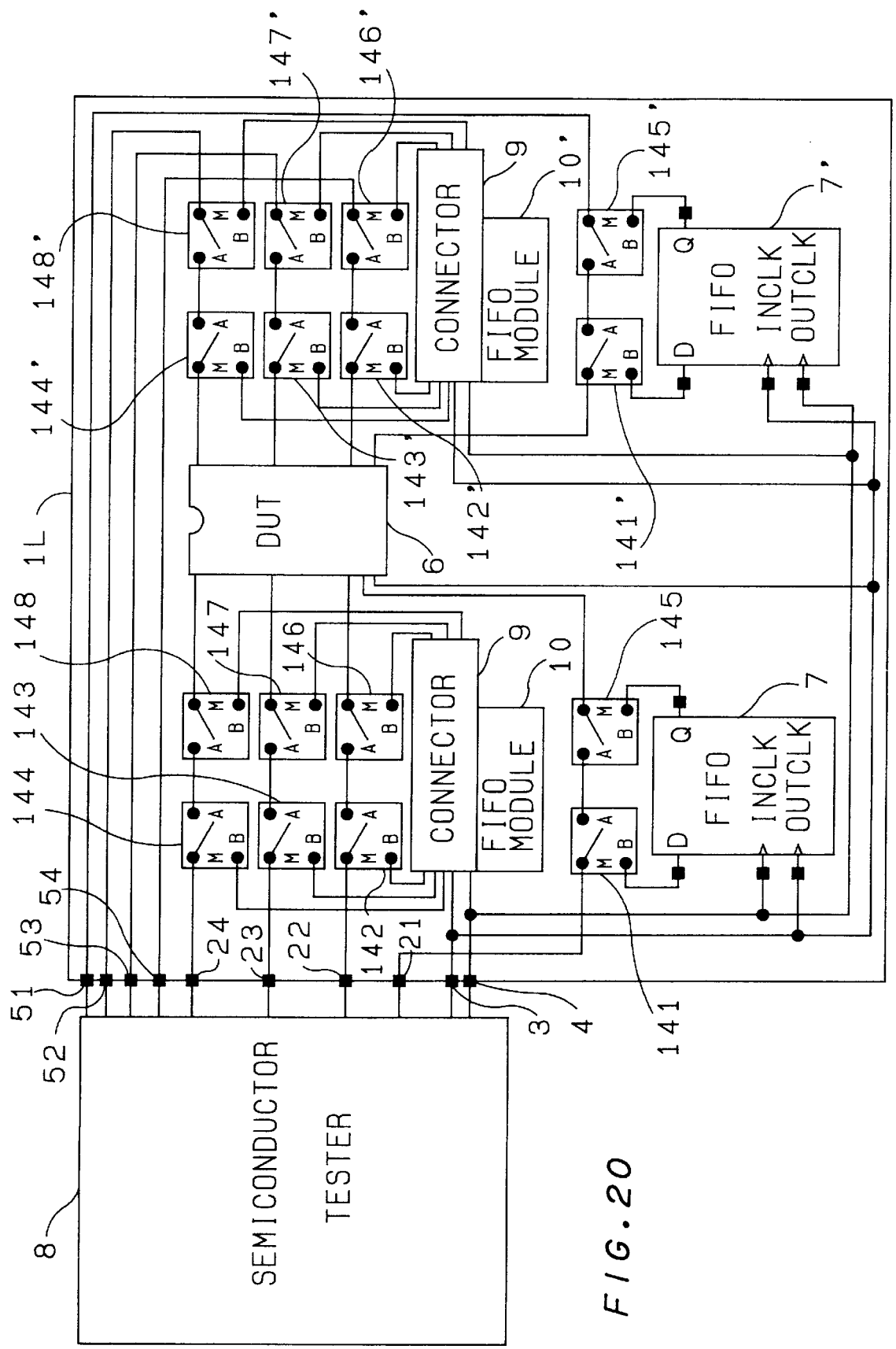
FIG. 20 is a block diagram for explaining the structure of a semiconductor device testing fixture according to a twelfth embodiment of the present invention.
Figure 21:
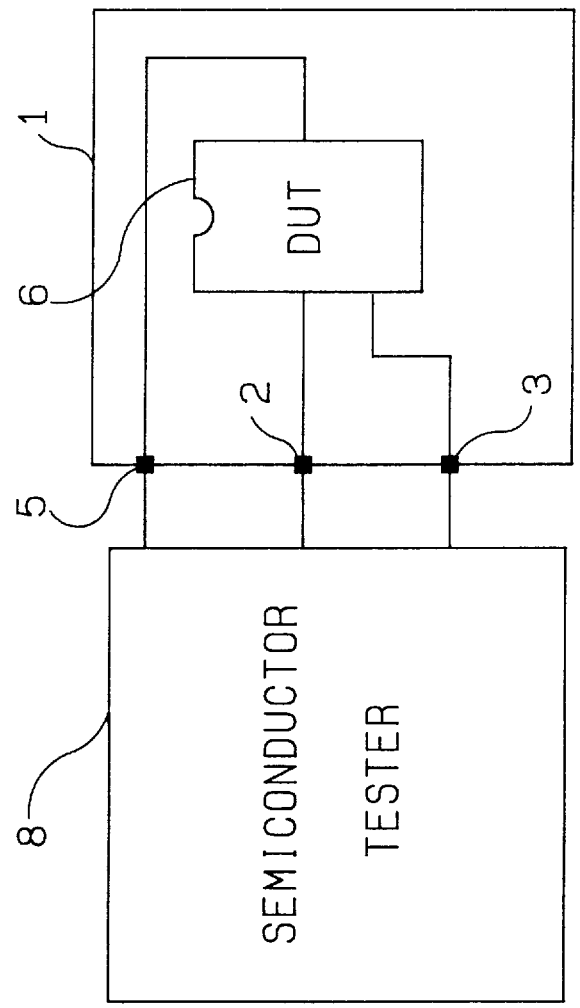
FIG. 21 is a block diagram for explaining the structure of a semiconductor device testing fixture according to the prior art.

FIG. 20 shows the structure of a semiconductor device testing fixture 1L according to a twelfth embodiment of the present invention.

The semiconductor device testing fixture 1L shown in FIG. 20 has a structure in which the semiconductor device testing fixture 1D described with reference to FIG. 10 is combined with the semiconductor device testing fixture 1H described with reference to FIG. 16.

In FIG. 20, a DUT 6 having a 4-bit input and a 4-bit output is mounted on the semiconductor device testing fixture 1L, and a semiconductor tester 8 for testing the DUT 6 is connected to the semiconductor device testing fixture 1L.

The semiconductor device testing fixture 1L has input terminals 21 to 24, 3 and 4, and output terminals 51 to 54 for receiving and sending a signal together with the semiconductor tester 8. Furthermore, FIFOs 7 and 7', FIFO modules 10 and 10', and relay devices 141 to 148 and 141' to 148' are mounted on the semiconductor device testing fixture 1L.

In FIG. 20, the input terminals 21 to 24 are connected to main terminals M of the relay devices 141 to 144 respectively to receive a test pattern from the semiconductor tester 8.

The FIFOs 7 and 7', and connectors 9 of the FIFO modules 10 and 10' and the DUT 6 are connected to the input terminal 3 to which a clock signal CL1 is sent from the semiconductor tester 8. The clock signal CL1 is sent to an input terminal OUTCLK in the FIFO 7, and to an input terminal INCLK in the FIFO 7'.

The FIFOs 7 and 7', and the connectors 9 of the FIFO modules 10 and 10' are connected to the input terminal 4 to which a clock signal CL2 is sent from the semiconductor tester 8. The clock signal CL2 is sent to an input terminal INCLK in the FIFO 7, and to an input terminal OUTCLK in the FIFO 7'.

In FIG. 20, a switching terminal B of the relay device 141 is connected to a data input terminal D of the FIFO 7, and switching terminals B of the relay devices 142 to 144 are connected to the connector 9 of the FIFO module 10.

Switching terminals A of the relay devices 141 to 144 are connected to those of the relay devices 145 to 148, respectively. A switching terminal B of the relay device 145 is connected to a data output terminal Q of the FIFO 7. Switching terminals B of the relay devices 146 to 148 are connected to the connector 9 of the FIFO module 10.

Main terminals M of the relay devices 145 to 148 are connected to the predetermined input terminals of the DUT 6, respectively.

Furthermore, a switching terminal B of the relay device 141' is connected to a data input terminal D of the FIFO 7'. Switching terminals B of the relay devices 142' to 144' are connected to the connector 9 of the FIFO module 10'.

In addition, the predetermined output terminals of the DUT 6 are connected to main terminals M of the relay devices 141' to 144', respectively. Switching terminals A of the relay devices 141' to 144' are connected to those of the relay devices 145' to 148', respectively. A switching terminal B of the relay device 145' is connected to a data output terminal Q of the FIFO 7'. Switching terminals B of the relay devices 146' to 148' are connected to the connector 9 of the FIFO module 10'.

Main terminals M of the relay devices 145' to 148' are connected to the output terminals 51 to 54, respectively.

<L-2. Operation of Apparatus>

In the case where the AC test of the DUT 6 is performed by using the semiconductor device testing fixture 1L, at least either of all the main terminals M of the relay devices 141 to 148 and all the main terminals M of the relay devices 141' to 148' are connected to the switching terminals B.

More specifically, if all the main terminals M of the relay devices 141 to 148 are connected to the switching terminals B and all the main terminals M of the relay devices 141' to 148' are connected to the switching terminals A, the operation of the AC test is performed in the same manner as in the semiconductor device testing fixture 1F described with reference to FIG. 12.

If all the main terminals M of the relay devices 141' to 148' are connected to the switching terminals B and all the main terminals M of the relay devices 141 to 148 are connected to the switching terminals A, the operation of the AC test is performed in the same manner as in the semiconductor device testing fixture 1B described with reference to FIG. 3.

When all the main terminals M of the relay devices 141 to 148 and 141' to 148' are connected to the switching terminals B, the operation of the AC test is obtained by the combination of the operation of the semiconductor device testing fixture 1F described with reference to FIG. 12 and that of the semiconductor device testing fixture 1B described with reference to FIG. 3.

In the case where the DC test of the DUT 6 is performed by using the semiconductor device testing fixture 1L, all the main terminals M of the relay devices 141 to 148 and 141' to 148' are connected to the switching terminals A so that the test patterns given from the input terminals 21 to 24 are not sent to the FIFOs 7 and 7' and the FIFO modules 10 and 10' but are directly sent to the DUT 6.

<L-3. Characteristic Function and Effect>

In the case where the semiconductor device testing fixture 1H is provided with the relay devices 141 to 148 and 141' to 148' to perform the DC test of the DUT 6, a signal path is switched so as to directly send the test pattern to the DUT 6 without using the FIFO. Thus, it is possible to obtain the semiconductor device testing fixture which can be used for the DC test as well as the AC test.

When performing the DC test, the FIFOs 7 and 7', and the FIFOs in the FIFO modules 10 and 10' are completely disconnected electrically from a path through which the output signal of the DUT 6 is sent by the relay devices 141 to 148 and 141' to 148'. Consequently, it is possible to prevent the FIFO from becoming a load to change the test pattern. Thus, the test can be performed with high precision.

While the invention has been described in detail, the foregoing description is in all aspects illustrative and not restrictive. It is understood that numerous other modifications and variations can be devised without departing from the scope of the invention.

I claim:

1. A semiconductor device testing fixture for electrically connecting a semiconductor tester to a tested semiconductor device, said semiconductor tester executing the performance tests of said tested semiconductor device by inputting a test pattern to said tested semiconductor device for comparing an output signal of said tested semiconductor device, corresponding to said test pattern, with a prepared expected value, comprising:

signal holding means connected to said tested semiconductor device for receiving said output signal of said tested semiconductor device, temporarily holding said output signal, and then sending said output signal to said semiconductor tester at a predetermined frequency, wherein said predetermined frequency is selected to be equal to or lower than a maximum test frequency having a value which indicates the testing capability of said semiconductor tester.

2. The semiconductor device testing fixture of claim 1, wherein said signal holding means has at least one memory which can perform first in first out operation for data, said at least one memory has the function of fetching said output signal of said tested semiconductor device based on a first clock signal sent from said semiconductor tester, and outputting said output signal in order of fetch based on a second clock signal sent from said semiconductor tester.

3. The semiconductor device testing fixture of claim 2, wherein said at least one memory is a plurality of memories, and at least a part of said plurality of memories are modularized, are removably attached to a predetermined connector, and are electrically connected to said tested semiconductor device and said semiconductor tester through said predetermined connector.

4. The semiconductor device testing fixture of claim 1, wherein said signal holding means has a plurality of memories which can perform first in first out operation for data, said plurality of memories have the function of controlling the output of hold data on receipt of a predetermined signal, the data output terminals thereof being connected to said semiconductor tester in common, said plurality of memories fetch said output signal of said tested semiconductor device based on a first clock signal sent from said semiconductor tester, said semiconductor device testing fixture further comprising:

signal generating means for generating said predetermined signal to be individually sent to said plurality of memories, and for generating a third clock signal to be individually sent to said plurality of memories based on a second clock signal sent from said semiconductor tester, wherein said predetermined signal and said third clock signal are generated so as to be brought into the significant condition with different timings for said plurality of memories, and said plurality of memories output said output signal fetched based on said first clock signal if said predetermined signal is in the significant condition and said third clock signal is brought into the significant condition.

5. The semiconductor device testing fixture of claim 4, wherein said signal generating means has the function of selectively sending, to said plurality of memories, said predetermined signal and said third clock signal which are in the significant condition.

6. The semiconductor device testing fixture of claim 1, further comprising relay means interposed between a predetermined output terminal from which said output signal of said tested semiconductor device is outputted and a predetermined input terminal of said semiconductor tester to which said output signal is inputted for switching a path for said output signal so as to choose whether said output signal of said tested semiconductor device is sent to said signal holding means or is directly sent to said semiconductor tester without passing said holding means.

7. The semiconductor device testing fixture of claim 6, wherein said relay means has a first relay device for electrically connecting or disconnecting the data input terminal of said signal holding means to or from said predetermined output terminal of said tested semiconductor device; and a second relay device for electrically connecting or disconnecting the data output terminal of said signal holding means to or from said predetermined input terminal of said semiconductor tester.

8. A semiconductor device testing fixture for electrically connecting a semiconductor tester to a tested semiconductor device, said semiconductor tester executing the performance tests of said tested semiconductor device by inputting a test pattern to said tested semiconductor device for comparing the output signal of said tested semiconductor device, corresponding to said test pattern, with a prepared expected value, comprising:

signal holding means connected to said semiconductor tester for receiving said test pattern from said semiconductor tester, temporarily holding said test pattern, and then giving said test pattern to said tested semiconductor device at a predetermined frequency, wherein said predetermined frequency is selected to be the practical operating frequency of said tested semiconductor device.

9. The semiconductor device testing fixture of claim 8, wherein said signal holding means has at least one memory which can perform first in first out operation for data, said at least one memory has the function of fetching said test pattern from said semiconductor tester based on a first clock signal sent from said semiconductor tester, and outputting said test pattern in order of fetch based on a second clock signal sent from said semiconductor tester.

10. The semiconductor device testing fixture of claim 9, wherein said at least one memory is a plurality of memories, and at least a part of said plurality of memories are modularized, are removably attached to a predetermined connector, and are electrically connected to said semiconductor tester and said tested semiconductor device through said predetermined connector.

11. The semiconductor device testing fixture of claim 8, wherein said signal holding means has a plurality of memories which can perform first in first out operation for data, said plurality of memories have the function of controlling the input of data to be fetched on receipt of a predetermined signal, said plurality of memories output said fetched test pattern based on a first clock signal sent from said semiconductor tester, said semiconductor device testing fixture further comprising;

signal generating means for generating said predetermined signal to be individually sent to said plurality of memories, and for generating a third clock signal to be individually sent to said plurality of memories based on a second clock signal sent from said semiconductor tester, wherein said predetermined signal and said third clock signal are generated so as to be brought into the significant condition with different timings for said plurality of memories, and said plurality of memories fetch said test pattern based on said third clock signal if said predetermined signal is in the significant condition and said third clock signal is brought into the significant condition.

12. The semiconductor device testing fixture of claim 11, wherein said signal generating means has the function of selectively sending, to said plurality of memories, said predetermined signal and said third clock signal which are in the significant condition.

13. The semiconductor device testing fixture of claim 8, further comprising relay means interposed between a predetermined output terminal from which said test pattern of said semiconductor tester is outputted and a predetermined input terminal of said tested semiconductor device to which said test pattern is inputted for switching a path for said test pattern so as to choose whether said test pattern of said semiconductor tester is sent to said signal holding means or is directly sent to said tested semiconductor device without passing said signal holding means.

14. The semiconductor device testing fixture of claim 13, wherein said relay means has a first relay device for electrically connecting or disconnecting the data input terminal of said signal holding means to or from said predetermined output terminal of said semiconductor tester; and a second relay device for electrically connecting or disconnecting the data output terminal of said signal holding means to or from said predetermined input terminal of said tested semiconductor device.

15. A semiconductor device testing fixture for electrically connecting a semiconductor tester to a tested semiconductor device, said semiconductor tester executing performance tests of said tested semiconductor device by providing a test pattern to said tested semiconductor device for comparison with an output signal of said tested semiconductor device corresponding to said test inputted pattern with a prepared expected value, said testing fixture comprising:

first signal holding means connected to said semiconductor tester for receiving said test pattern from said semiconductor tester, temporarily holding said test pattern, and then selectively outputting said test pattern to said tested semiconductor device at a first frequency; and second signal holding means connected to said tested semiconductor device for receiving said output signal of said tested semiconductor device, temporarily holding said output signal, and then outputting said output signal to said semiconductor tester at a selected second frequency, wherein said first frequency is the practical operating frequency of said tested semiconductor device, and said second frequency is equal to or lower than a maximum test frequency having a value which indicates the testing capability of said semiconductor tester.

\* \* \* \* \*